(12) United States Patent
Kanda et al.

(10) Patent No.: US 8,228,624 B2
(45) Date of Patent: Jul. 24, 2012

(54) DRIVE UNIT, LENS BARREL, AND CAMERA

(75) Inventors: Yoshihiro Kanda, Osaka (JP); Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 12/718,115

(22) Filed: Mar. 5, 2010

(65) Prior Publication Data

US 2010/0226637 A1  Sep. 9, 2010

(30) Foreign Application Priority Data

Mar. 6, 2009  (JP) ................................ 2009-053959

(51) Int. Cl.
*G02B 7/02* (2006.01)
*G02B 15/14* (2006.01)
(52) U.S. Cl. ........................................ 359/824; 359/696
(58) Field of Classification Search .......... 359/694–704, 359/811–824; 310/323.17, 316.02, 323, 310/32; 396/55, 131
See application file for complete search history.

(56) References Cited

U.S. PATENT DOCUMENTS

| | | | | |
|---|---|---|---|---|
| 4,954,742 A * | 9/1990 | Izukawa | .................. | 310/316.02 |
| 5,495,152 A * | 2/1996 | Fukui | ............................ | 318/116 |
| 5,889,350 A * | 3/1999 | Yamamoto | .............. | 310/316.01 |
| 7,986,468 B2 * | 7/2011 | Abe et al. | ..................... | 359/694 |

FOREIGN PATENT DOCUMENTS

JP  09-191669  7/1997

\* cited by examiner

*Primary Examiner* — Mohammed Hasan
(74) *Attorney, Agent, or Firm* — Renner, Otto, Boisselle & Sklar, LLP

(57) ABSTRACT

A drive unit includes an ultrasonic actuator, which has an actuator body formed using a piezoelectric element and outputs a driving force by vibration of the actuator body, and a control section which induces vibration in the actuator body by supplying a plurality of AC voltages to the piezoelectric element. The control section provides, in combination, phase control, which controls the driving force by adjusting a phase difference between a first and a second AC voltages, and wave-number control, which controls the driving force by adjusting the wave number included in a predetermined burst period in each AC voltage.

20 Claims, 28 Drawing Sheets

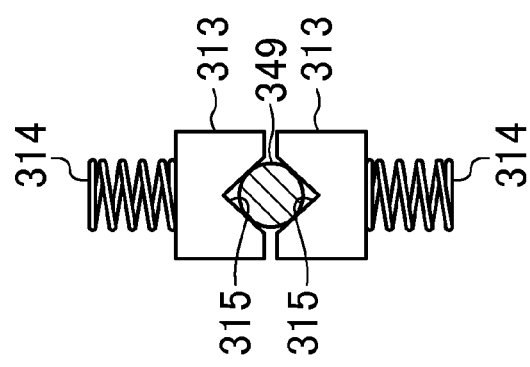
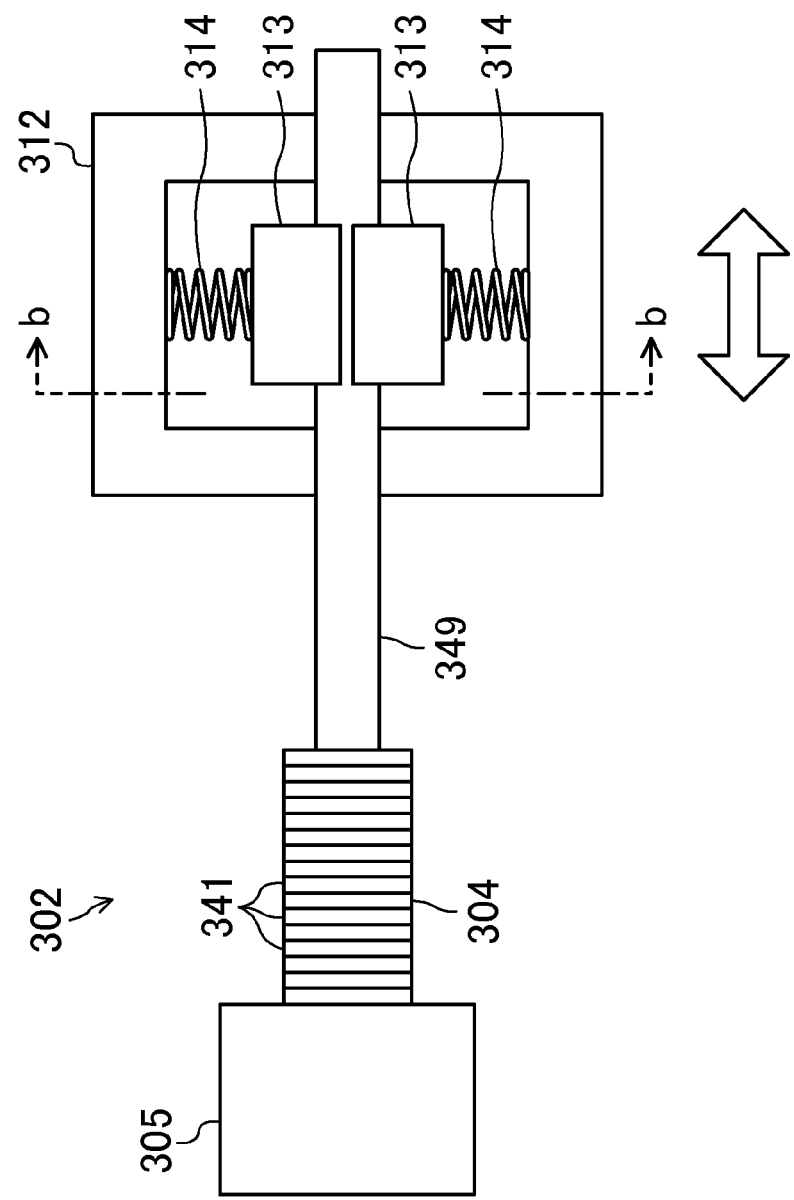

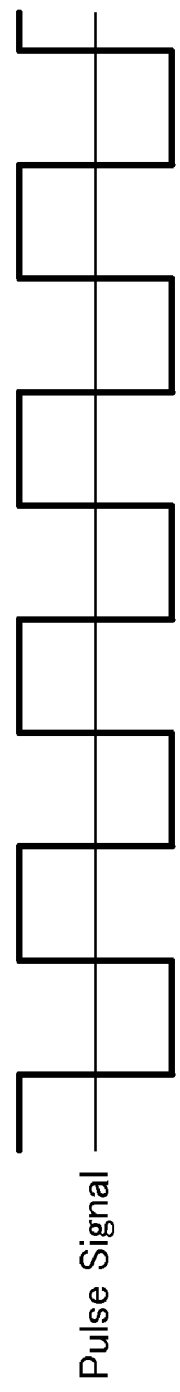
FIG. 28A  Pulse Signal
FIG. 28B  Drive Shaft Position

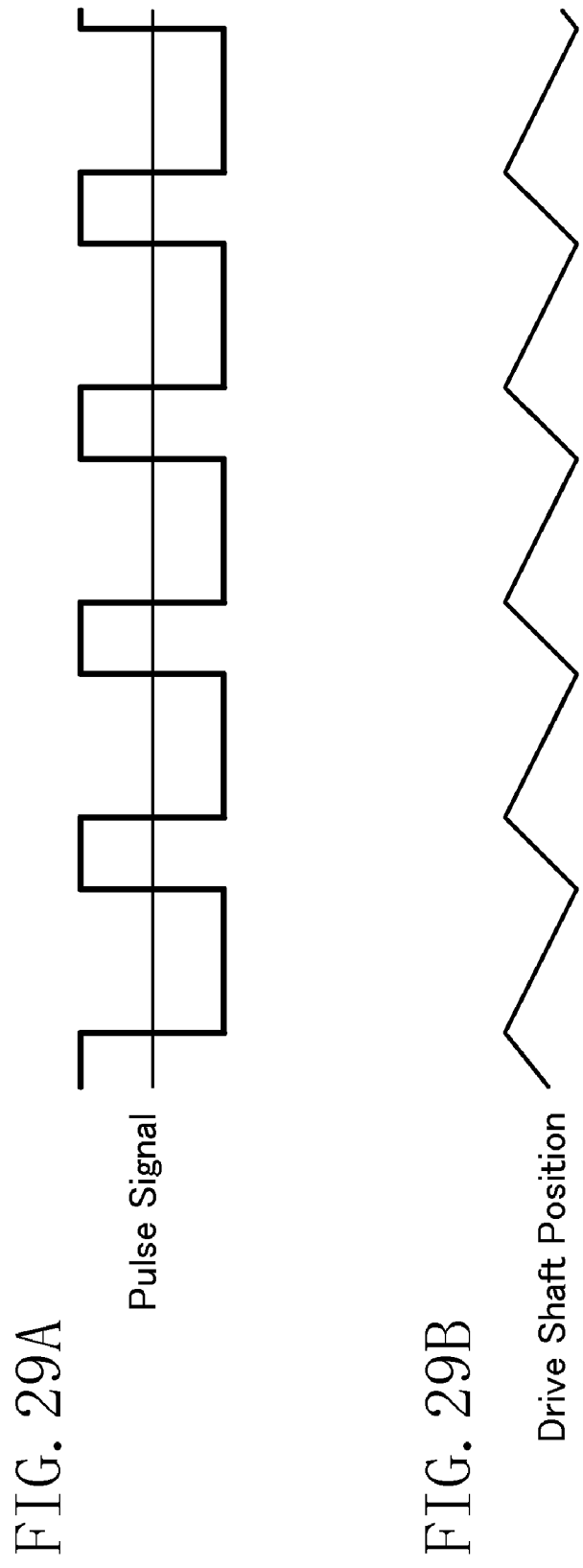

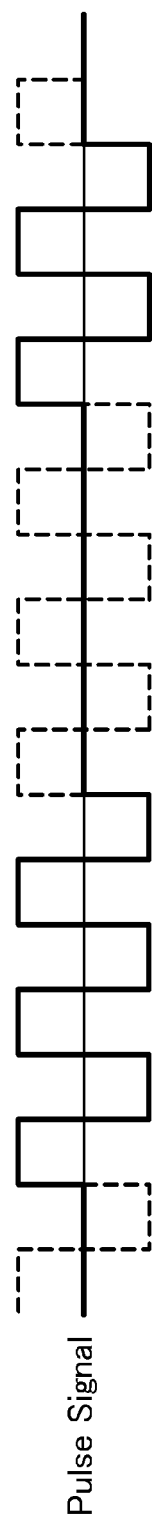
FIG. 31A  Pulse Signal
FIG. 31B  Drive Shaft Position

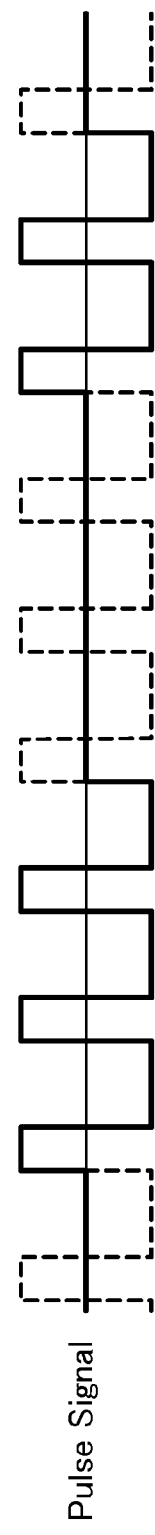
FIG. 32A  Pulse Signal
FIG. 32B  Drive Shaft Position

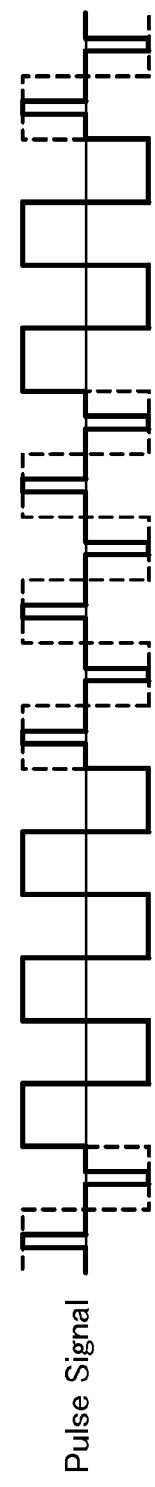
FIG. 33A Pulse Signal
FIG. 33B Drive Shaft Position

Pulse Signal

Drive Shaft Position

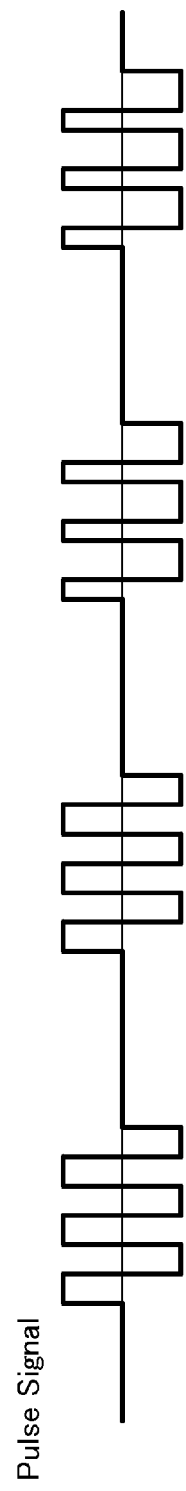
FIG. 35A  Pulse Signal
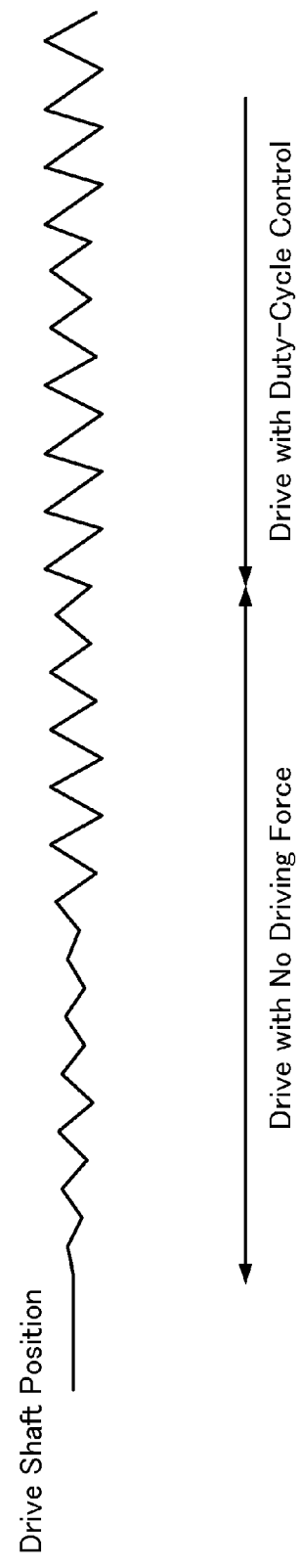
FIG. 35B  Drive Shaft Position

DRIVE UNIT, LENS BARREL, AND CAMERA

CROSS-REFERENCE TO RELATED APPLICATION

This application claims priority to Japanese Patent Application No. 2009-053959 filed on Mar. 6, 2009, the disclosure of which including the specification, the drawings, and the claims is hereby incorporated by reference in its entirety.

BACKGROUND

1. Field of Technology

The present disclosure relates to a drive unit having a vibratory actuator.

2. Description of Related Art

A drive unit having a vibratory actuator is conventionally known. For example, a vibratory actuator included in a drive unit, disclosed in Japanese Unexamined Patent Application Publication No. H09-191669, is formed using a piezoelectric element, and induces vibration in the piezoelectric element by applying two alternating current (AC) voltages to the piezoelectric element, thereby allowing a driving force to be output.

In this drive unit, frequency control, which varies the frequency of the two AC voltages, and voltage control, which varies the voltage value of the two AC voltages, are provided in combination in order to control the driving force of the vibratory actuator.

SUMMARY

However, as described above, when a driving force is controlled by frequency control and/or voltage control, a dead zone is wide in a range in which a required driving force is small. Specifically, when the frequency of the two AC voltages is largely shifted from a resonant frequency of the piezoelectric element, or when the voltage value of the two AC voltages is excessively reduced in an attempt to reduce vibration of a piezoelectric element, sufficient vibration is not induced in the piezoelectric element, thus a low driving force cannot be properly output.

Meanwhile, in phase control, which controls a driving force by changing the phase difference between two AC voltages, the frequency of the AC voltages is not significantly shifted from a resonant frequency of the piezoelectric element, and an adequate voltage is ensured as well. Thus, the dead zone is narrow in a range in which a driving force is small, and a low driving force can be properly output.

However, in phase control, even when only a low driving force is output, the voltage value of the AC voltages is the same as when a high driving force is output, thereby creating a problem in that power consumption is high for a low driving force.

The disclosed technology is directed to overcoming the foregoing and other disadvantages, and the object of the disclosed technology is to properly output a low driving force, and to reduce power consumption associated therewith.

A drive unit according to this disclosure includes a vibratory actuator having an actuator body formed using a piezoelectric element, and configured to output a driving force by vibration of the actuator body, and a control section configured to induce vibration in the actuator body by supplying a plurality of pulse signals to the piezoelectric element; and the control section provides, in combination, phase control, which controls the driving force by adjusting a phase difference between the plurality of pulse signals, and wave-number control, which controls the driving force by adjusting the number of pulses included in a predetermined burst period in each of the pulse signals.

Alternatively, a drive unit according to this disclosure includes a vibratory actuator having an actuator body formed using a piezoelectric element, and configured to output a driving force by vibration of the actuator body, and a control section configured to induce vibration in the actuator body by supplying a single-phase pulse signal to the piezoelectric element; and the control section provides, in combination, duty-cycle control, which controls the driving force by adjusting a duty cycle of the single-phase pulse signal, and wave-number control, which controls the driving force by adjusting the number of pulses included in a predetermined burst period in the pulse signal.

A lens barrel according to this disclosure includes a lens and the drive unit configured to drive the lens.

A camera according to this disclosure includes a lens and the drive unit configured to drive the lens.

According to the disclosed technology, even if the required driving force is small, a desired driving force can be properly output using phase control or duty-cycle control, and power consumption can be reduced using wave-number control.

BRIEF DESCRIPTION OF THE DRAWINGS

FIG. 24A is a map for a monitoring parameter and the number of pulses, and FIG. 24B is a map for a monitoring parameter and the pulse width.

FIGS. 27A and 27B are schematic diagrams of an ultrasonic actuator. FIG. 27A is a side view, and FIG. 27B is a cross-sectional view along the line b-b thereof.

FIGS. 28A and 28B are graphs each illustrating a characteristic in a stand-by state. FIG. 28A shows a drive signal, and FIG. 28B shows a position of the drive shaft.

FIGS. 29A and 29B are graphs each illustrating a characteristic in a drive state. FIG. 29A shows a drive signal, and FIG. 29B shows a position of the drive shaft.

FIGS. 31A and 31B are graphs illustrating wave-number control in a stand-by state. FIG. 31A shows a drive signal, and FIG. 31B shows a position of the drive shaft.

FIGS. 32A and 32B are graphs illustrating wave-number control in a drive state. FIG. 31A shows a drive signal, and FIG. 31B shows a position of the drive shaft.

FIGS. 33A and 33B are graphs illustrating wave-number control outputting short pulses in a stand-by state. FIG. 33A shows a characteristic of a drive signal, and FIG. 33B shows a characteristic of a drive shaft position.

FIG. 34A shows a drive signal, and FIG. 34B shows a position of the drive shaft.

FIGS. 35A and 35B are graphs illustrating starting control. FIG. 35A shows a drive signal, and FIG. 35B shows a position of the drive shaft.

DETAILED DESCRIPTION

Example embodiments will be described below in detail with reference to the drawings.

First Embodiment

Figure 1:
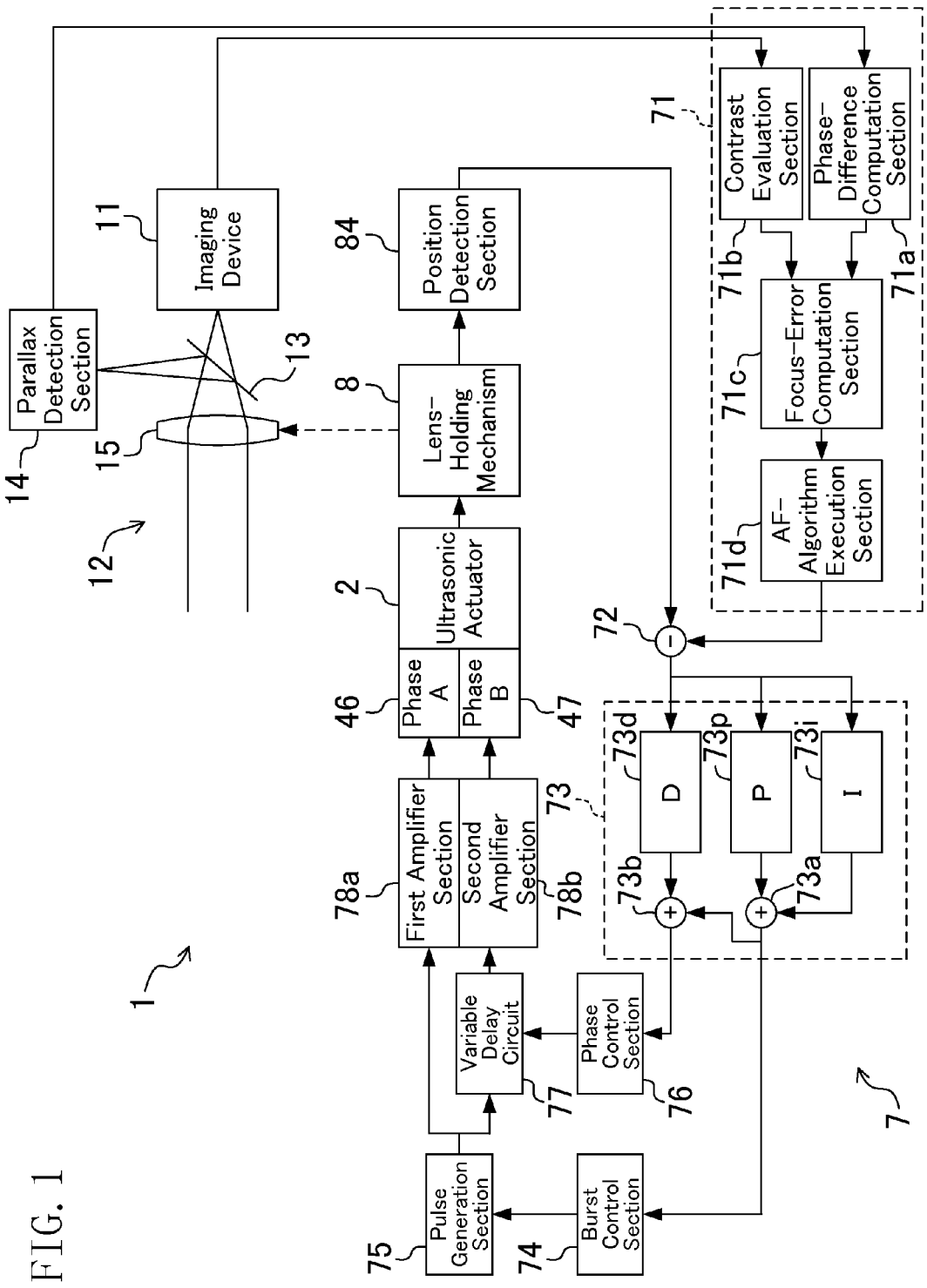
FIG. 1 is a block diagram illustrating a configuration of a camera having a drive unit in accordance with an example embodiment.

A camera system 1 which includes a drive unit in accordance with the first embodiment will now be described with reference to FIG. 1. FIG. 1 is a block diagram illustrating a configuration of a camera.

The camera system 1 includes an imaging device 11, an imaging optical system 12, which forms an object image on the imaging device 11, a reflection mirror 13 provided on an optical axis between the imaging device 11 and the imaging optical system 12, a parallax detection section 14, which receives light directed by the reflection mirror 13 and detects a parallax, and a control section 7, which controls a focusing-lens drive section 16 (described later) provided in the imaging optical system 12.

The imaging device 11 is formed of a CCD (Charge Coupled Device) or a CMOS (Complementary Metal Oxide Semiconductor), and converts an object image formed on an imaging plane to electric signals by photoelectric conversion.

The imaging optical system 12 includes a lens group having at least one focusing lens 15, and a focusing-lens drive section 16, which drives the focusing lens 15. A detailed configuration of the focusing-lens drive section 16 will be described later.

The reflection mirror 13 is provided on an optical axis between the imaging device 11 and the imaging optical system 12, and is configured to be switchable between a reflection state, in which the reflection mirror 13 reflects and directs light incident from the imaging optical system 12 to the parallax detection section 14, and a retraction state, in which the reflection mirror 13 is withdrawn from the optical axis. That is, the reflection mirror 13 will be in the reflection state when detecting a parallax of an object image for an auto-focusing process, and will be in the retraction state when exposing the imaging device 11 to light.

The parallax detection section 14 detects a parallax of an object image. For example, the parallax detection section 14 includes a condenser lens, a separator lens, and a line sensor. Light incident on the condenser lens is collected by the condenser lens, and is input to the separator lens. The light is divided by pupil division in the separator lens, and is focused onto two points on the line sensor. Thus, an output signal of the line sensor is output from the parallax detection section 14.

The control section 7 controls the focusing-lens drive section 16 of the imaging optical system 12 based on the output signals from the imaging device 11 and the parallax detection section 14, and focuses the object image on the imaging plane of the imaging device 11. A detailed configuration of the control section 7 will be described later.

[Configuration of Focusing-Lens Drive Section]

Figure 2:
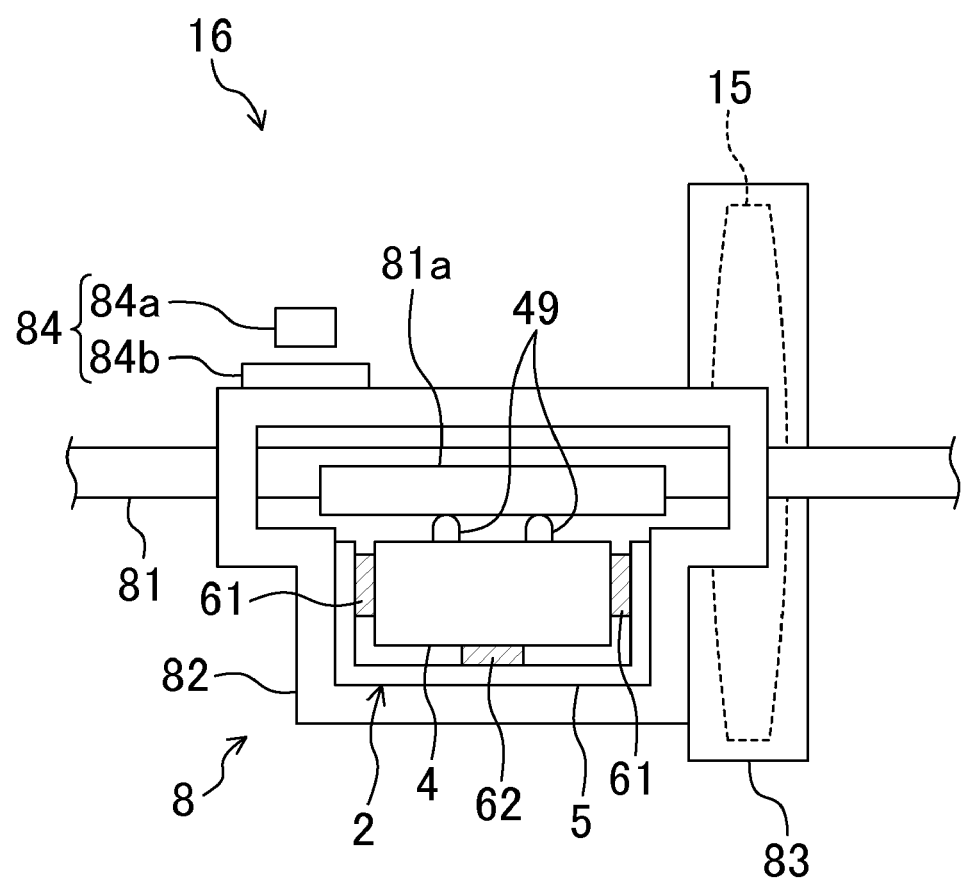
FIG. 2 is a front view illustrating a schematic configuration of a focusing-lens drive section.

A detailed configuration of the focusing-lens drive section 16 will now be described with reference to FIG. 2. FIG. 2 illustrates a schematic configuration of the focusing-lens drive section 16.

The focusing-lens drive section 16 includes an ultrasonic actuator 2, a lens-holding mechanism 8, and a position detection section 84. The ultrasonic actuator 2 and the control section 7 form the drive unit.

The lens-holding mechanism 8 includes a guide pole 81, a movable case 82, to which the ultrasonic actuator 2 is attached, and which is configured to be movable with respect to the guide pole 81, and a holding frame 83, which holds the focusing lens 15 and is integrally attached to the movable case 82. The lens-holding mechanism 8 is disposed on a lens group holder (not shown).

The guide pole 81 is fixedly provided with respected to the lens group holder so as to be expandable in parallel with the optical axis of the imaging optical system 12. An abutment member 81a, which is contacted by driver elements 49 (described later) of the ultrasonic actuator 2, is fixedly attached on the guide pole 81. Note that although the guide pole 81 is illustrated as being only one in FIG. 2, there may be provided multiple ones thereof.

The movable case 82 is configured so as to accommodate the ultrasonic actuator 2. The movable case 82 is attached so as to be slidable with respect to the guide pole 81. That is, the movable case 82 moves relative to the lens group holder.

The holding frame 83 is integrally attached to the movable case 82, and holds the focusing lens 15 in a position such that an optical axis thereof is coincident with the optical axis of the imaging optical system 12. The holding frame 83 moves along the guide pole 81 together with the movable case 82. That is, the focusing lens 15 held by the holding frame 83 moves along the optical axis of the imaging optical system 12, according to the movement of the movable case 82.

The position detection section 84 includes a magnetic sensor 84a and a magnetic scale 84b. The magnetic scale 84b is attached to the movable case 82. The magnetic sensor 84a is attached to the lens group holder so as to face the magnetic scale 84b and be spaced apart by a predetermined distance from the magnetic scale 84b. The magnetic sensor 84a includes an MR (magnetoresistive) sensor, which detects a signal from the magnetic scale 84b, etc.

[Configuration of Ultrasonic Actuator]

A detailed configuration of the ultrasonic actuator 2 will now be described with reference to FIGS. 2-7.

Figure 3:
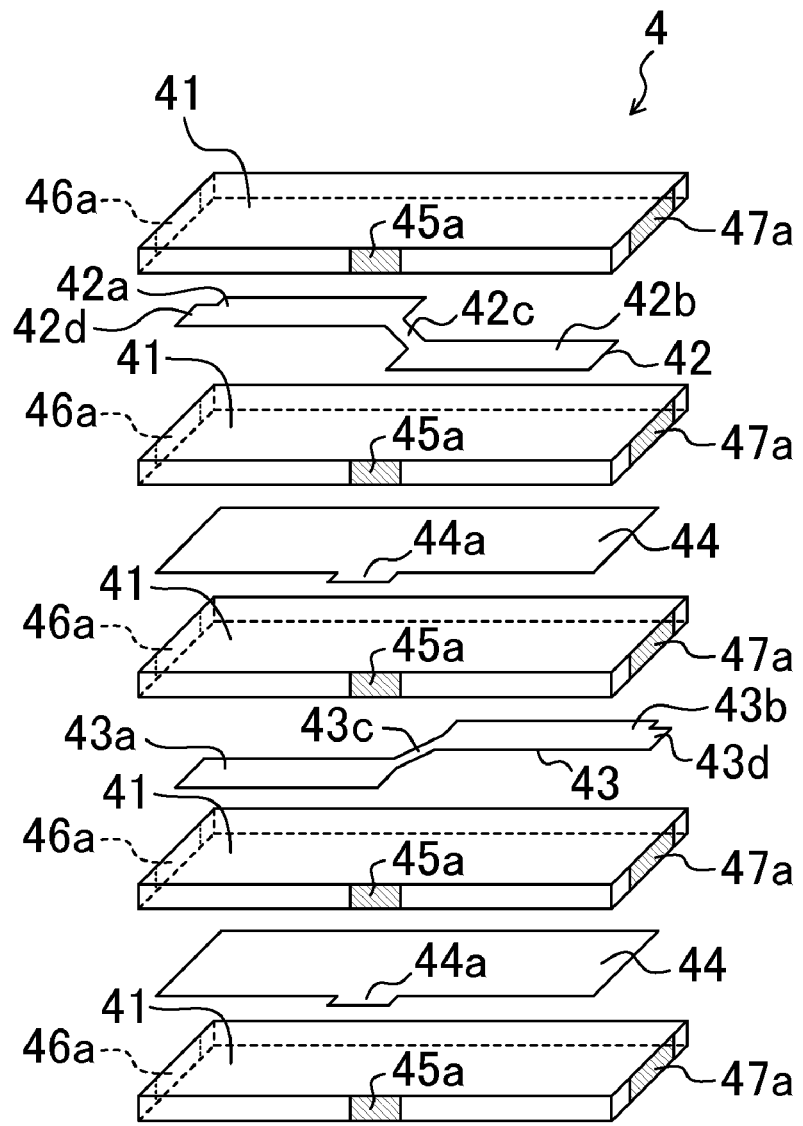
FIG. 3 is an exploded perspective view of an actuator body of an ultrasonic actuator.
Figure 4:
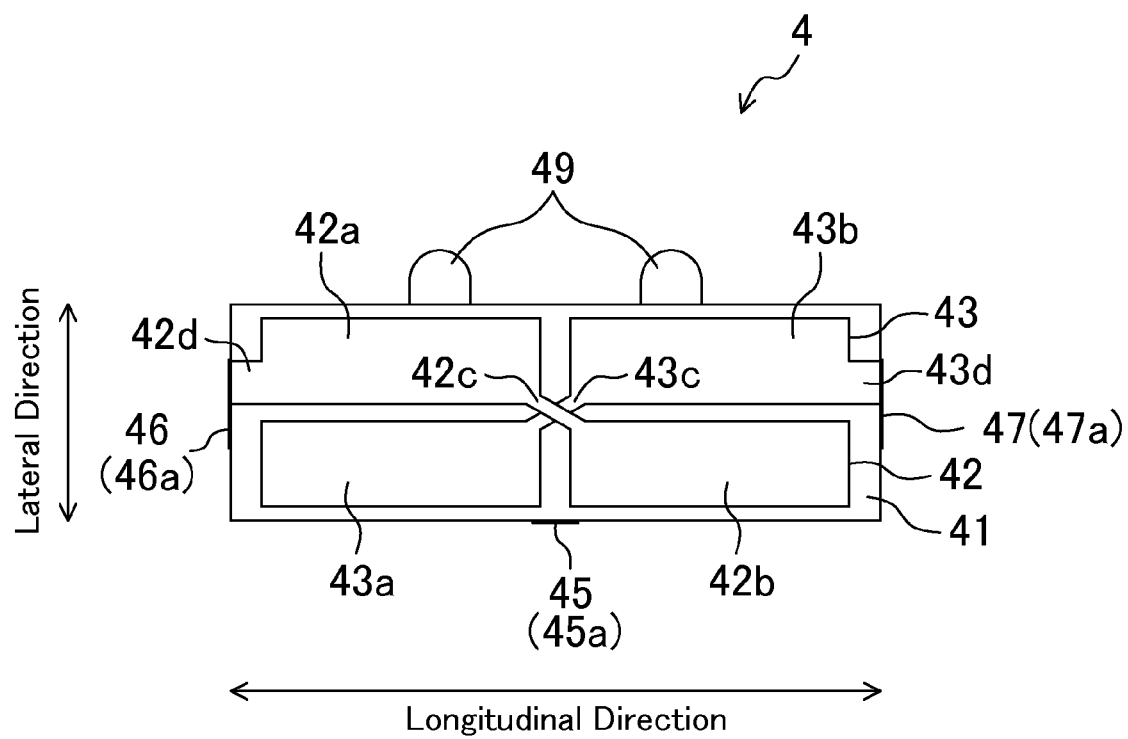
FIG. 4 is a schematic top view of an actuator body.
Figure 5:
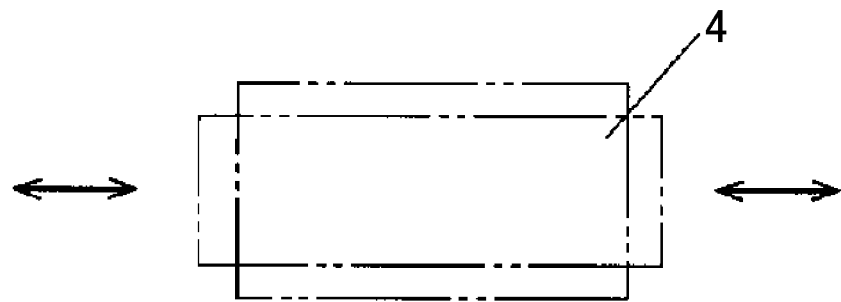
FIG. 5 is a front view illustrating deformation of an actuator body caused by a first-order mode of stretching vibration.
Figure 6:
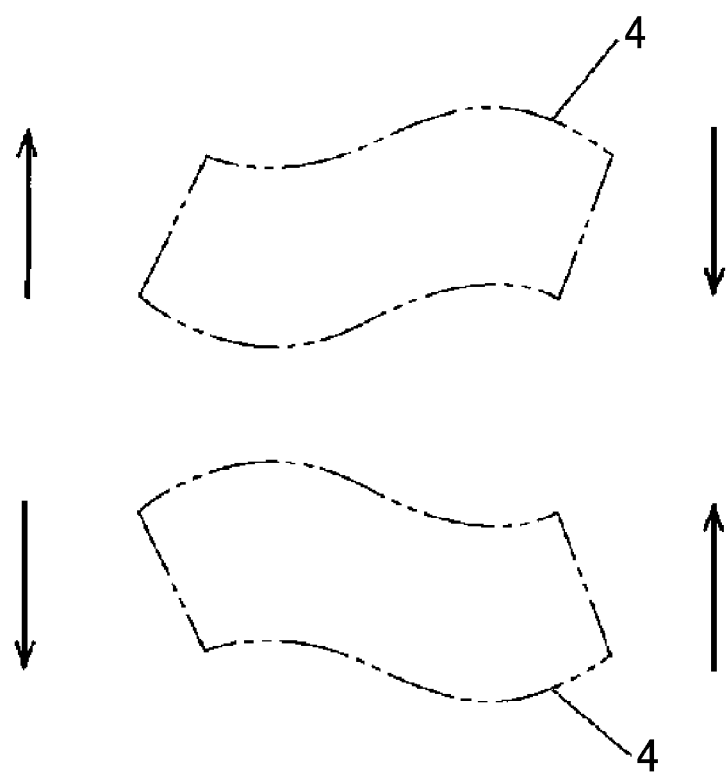
FIG. 6 is a front view illustrating deformation of an actuator body caused by a second-order mode of bending vibration.
Figure 7A:
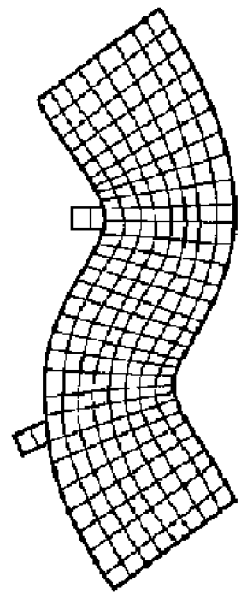
FIGS. 7A-7D are front views each illustrating deformation of an actuator body caused by composite vibration.
Figure 7B:
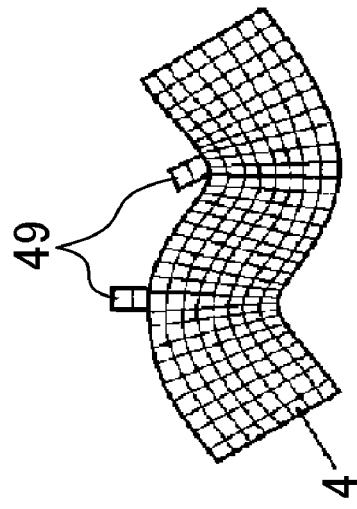
Figure 7C:
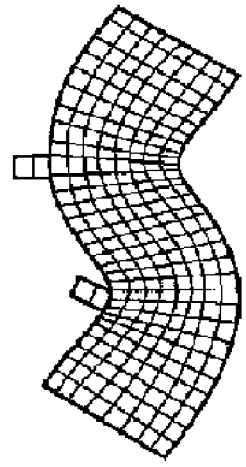
Figure 7D:
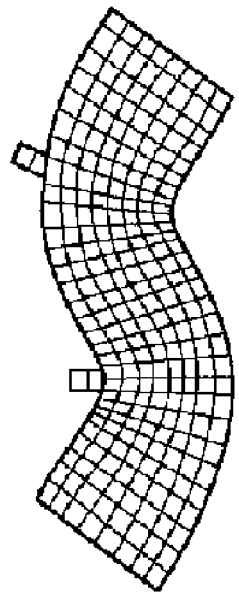

FIG. 3 is an exploded perspective view of an actuator body of the ultrasonic actuator 2. FIG. 4 is a schematic top view of the actuator body. FIG. 5 is a front view illustrating deformation of the actuator body caused by a first-order mode of stretching vibration (expanding/contracting vibration). FIG. 6 is a front view illustrating deformation of the actuator body caused by a second-order mode of bending vibration. FIGS. 7A-7D are front views each illustrating deformation of the actuator body caused by composite vibration.

As shown in FIG. 2, the ultrasonic actuator 2 includes an actuator body 4 which produces vibration, driver elements 49 which output driving forces of the actuator body 4, a case 5 which accommodates the actuator body 4, rubber supports 61 each of which is provided between the actuator body 4 and the case 5, and elastically supports the actuator body 4, and a rubber biasing member 62 which biases the actuator body 4 toward the abutment member 81a of the guide pole 81. This ultrasonic actuator 2 forms a vibratory actuator.

The actuator body 4 has a generally rectangular parallelepiped shape, which has a pair of generally rectangular principal faces facing each other, a pair of longer side faces facing each other, orthogonal to the principal faces, and extending in the longitudinal direction of the principal faces, and a pair of shorter side faces facing each other, orthogonal to both the principal faces and the longer side faces, and extending in the lateral direction of the principal faces. The term "longitudinal direction" is used herein to describe the longitudinal direction of the principal faces, and the term "lateral direction" is used herein to describe the lateral direction of the principal faces.

The actuator body 4 is a piezoelectric element. As shown in FIG. 3, the actuator body 4 is formed by alternately stacking five piezoelectric element layers 41 and four internal electrode layers 42, 44, 43, and 44. Specifically, the internal electrode layers 42, 44, 43 and 44 are formed by a first power-supply electrode layer 42, a common electrode layer 44, a second power-supply electrode layer 43, and another common electrode layer 44, which are arranged alternately in the stacking direction (thickness direction) each between a corresponding pair of the piezoelectric element layers 41. The first power-supply electrode layer 42, the second power-supply electrode layer 43, and the common electrode layers 44 are each printed on one of the principal faces of the corresponding piezoelectric element layer 41.

Each of the piezoelectric element layers 41 is an insulator layer formed of, for example, a ceramic material such as lead zirconate titanate; and has a generally rectangular parallelepiped shape, which has a pair of principal faces, a pair of longer side faces, and a pair of shorter side faces, as does the actuator body 4. Each of the piezoelectric element layers 41 includes an external electrode 45a formed in a longitudinal center portion of one of the longer side faces, an external electrode 46a formed in a lateral center portion of one of the shorter side faces, and an external electrode 47a formed in a lateral center portion of the other one of the shorter side faces.

Each of the common electrode layers 44 has a generally rectangular shape provided over substantially the entire surface of the corresponding principal face of the piezoelectric element layers 41. An extraction electrode 44a is formed in one of the long-side portions of each of the common electrode layers 44 so as to extend from a longitudinal center portion thereof to the external electrodes 45a of the piezoelectric element layers 41.

As shown in FIG. 4, each of the principal faces of the piezoelectric element layers 41 has four regions, which are formed by dividing the principal faces in half both longitudinally and laterally. The four regions are grouped into two pairs of regions each having a diagonal relationship. The first power-supply electrode layer 42 includes a first set of electrodes 42a and 42b respectively formed in regions of one of the two diagonal pairs of regions, and a conductive electrode 42c, which couples the first set of electrodes 42a and 42b to conduct electricity therebetween. Each of the first set of electrodes 42a and 42b is an electrode of a generally rectangular shape, and overlaps the common electrode layers 44 in the stacking direction. A first electrode 42a, which is one of the first set of electrodes 42a and 42b, includes an extraction electrode 42d extending to the external electrodes 46a of the piezoelectric element layers 41.

The second power-supply electrode layer 43 includes a second set of electrodes 43a and 43b respectively formed in regions of the other one of the two diagonal pairs of regions on the principal faces of the piezoelectric element layers 41, and a conductive electrode 43c, which couples the second set of electrodes 43a and 43b to conduct electricity therebetween. Each of the second set of electrodes 43a and 43b is an electrode of a generally rectangular shape, and overlaps the common electrode layers 44 in the stacking direction. A second electrode 43a, which is one of the second set of electrodes 43a and 43b, includes an extraction electrode 43d extending to the external electrodes 47a of the piezoelectric element layers 41.

In the actuator body 4, which is formed by alternately stacking the piezoelectric element layers 41 and the internal electrode layers 42, 44, 43, and 44, the respective external electrodes 45a of the piezoelectric element layers 41 align in the stacking direction in the longitudinal center portion of one of the longer side faces, thereby collectively forming an integrated external electrode 45. That is, the external electrode 45 is electrically connected to the extraction electrodes 44a formed in the common electrode layers 44. Similarly, the respective external electrodes 46a of the piezoelectric element layers 41 align in the stacking direction in the lateral center portion of one of the shorter side faces of the actuator body 4, thereby collectively forming an integrated external electrode 46. That is, the external electrode 46 is electrically connected to the extraction electrode 42d of the first power-supply electrode layer 42. Furthermore, the respective external electrodes 47a of the piezoelectric element layers 41 align in the stacking direction in the lateral center portion of the other one of the shorter side faces of the actuator body 4, thereby collectively forming an integrated external electrode 47. That is, the external electrode 47 is electrically connected to the extraction electrode 43d of the second power-supply electrode layer 43.

The driver elements 49 are provided in a longitudinally spaced-apart relationship to each other on the other one of the longer side faces of the actuator body 4, in which the external electrodes 45*a* are not provided. The driver elements 49 are provided in each location longitudinally inward a distance of 30-35% of the full length of the longer side faces from each longitudinal end of the corresponding longer side face. Each of the location corresponds to an antinode of a second-order mode of bending vibration of the actuator body 4, which will be described later, and is a location where the vibration has a maximum amplitude. Each of the driver elements 49 is formed in a combined shape of a solid cylinder in the base-end side which is attached to the actuator body 4, and a hemisphere in the forward-end side. The driver elements 49 are made of hard material such as ceramic.

The case 5 is made of resin, and has a generally box-like shape which has a generally rectangular parallelepiped shape corresponding to the actuator body 4. The case 5 has no sidewall in a plane corresponding to the longer side face on which the driver elements 49 are provided, of the actuator body 4. That is, the side face of the case 5 corresponding to the driver elements 49 is opened.

The case 5 with such a configuration accommodates the actuator body 4. In this regard, the driver elements 49 protrude from the case 5. The rubber supports 61 are respectively provided between one shorter side face of the actuator body 4 and the case 5, and between the other shorter side face of the actuator body 4 and the case 5. Although both of the shorter side faces of the actuator body 4 correspond to antinodes of longitudinal vibration, the rubber supports 61 can support the actuator body 4 without adversely affecting longitudinal vibration of the actuator body 4 due to elasticity of the rubber supports 61. In addition, the rubber biasing member 62 is provided between one of the longer side faces of the actuator body 4 and the case 5.

Each of the rubber supports 61 is formed of conductive rubber which is silicone rubber filled with metal particles, and has a generally rectangular parallelepiped shape. The rubber supports 61 elastically support the actuator body 4 while biasing the actuator body 4 in the longitudinal direction thereof. In addition, the rubber supports 61 conduct electricity from the external electrodes 46 and 47 of the actuator body 4 to electrodes (not shown) provided on the case 5.

Similarly to the rubber supports 61, the rubber biasing member 62 is also formed of conductive rubber which is silicone rubber filled with metal particles, and has a generally rectangular parallelepiped shape. The rubber biasing member 62 is provided to bias the actuator body 4 in the lateral direction (i.e., the lateral direction corresponds to the direction to bias). In addition, the rubber biasing member 62 conducts electricity from the external electrode 45 of the actuator body 4 to an electrode (not shown) provided on the case 5.

Thus, supplying power to the terminal electrodes (not shown) provided on the case 5 allows the actuator body 4 to be supplied with power through the rubber supports 61 and the rubber biasing member 62.

The ultrasonic actuator 2 with such a configuration is attached to the movable case 82 so that the driver elements 49 contact the abutment member 81*a* of the guide pole 81. In this regard, the ultrasonic actuator 2 is attached to the movable case 82 so that the rubber biasing member 62 is deformed compressively. That is, the actuator body 4 is biased toward the abutment member 81*a*, and the driver elements 49 are pressed against the abutment member 81*a*.

The ultrasonic actuator 2 is supplied with power from the control section 7 under this condition. Specifically, signal lines extending from the control section 7 are connected to the terminal electrodes of the case 5. The external electrode 45 of the actuator body 4 is connected to ground through the rubber biasing member 62. The external electrodes 46 and 47 are supplied with different AC voltages (hereinafter also referred to as "drive voltages") through the rubber supports 61. In this regard, introducing a phase shift between the two drive voltages applied to the external electrodes 46 and 47 causes drive voltages having a phase difference therebetween to be respectively applied to the first sets of electrodes 42*a* and 42*b*, which form a pair disposed diagonally on the principal faces of the piezoelectric element layers 41, and the second sets of electrodes 43*a* and 43*b*, which form the other pair, thereby inducing in the actuator body 4 both stretching vibration in the longitudinal direction thereof (so-called "longitudinal vibration") and bending vibration in the lateral direction thereof (so-called "lateral vibration").

In order to efficiently vibrate the actuator body 4, it is preferable that a frequency of a drive voltage applied to the actuator body 4 be a resonant frequency or an anti-resonant frequency of stretching vibration or bending vibration of the actuator body 4. The resonant frequencies or the anti-resonant frequencies of the actuator body 4 are affected by the material, shape, etc., of the actuator body 4, as well as by the supporting forces and the supported locations of the actuator body 4. That is, the shape, etc., of the actuator body 4 is designed so that the resonant frequency or the anti-resonant frequency of a desired mode of stretching vibration and the resonant frequency or the anti-resonant frequency of a desired mode of bending vibration will be coincident, and a drive voltage having this resonant frequency or anti-resonant frequency is applied to the actuator body 4. For example, the shape, etc., of the actuator body 4 is designed so that the resonant frequency of the first mode of stretching vibration (see FIG. 5) and the resonant frequency of the second mode of bending vibration (see FIG. 6) are coincident, a phase shift is introduced between two drive voltages of a frequency near the resonant frequency, and then, the drive voltages are respectively applied to the external electrodes 46 and 47 of the actuator body 4. This induces the first mode of stretching vibration and the second mode of bending vibration in a coordinated manner in the actuator body 4, thereby causing a sequential shape change as shown in FIGS. 7A-7D.

Accordingly, each of the driver elements 49 moves in an orbital path (specifically, a generally elliptical path) in a plane parallel to the principal faces of actuator body 4, i.e., a plane including the longitudinal and lateral directions (a plane parallel to the paper in FIGS. 7A-7D). In this regard, since the driver elements 49 contact the abutment member 81*a* of the guide pole 81, each of the driver elements 49 increases friction force on the abutment member 81*a* as moving in one direction along a longitudinal direction of the guide pole 81 during the orbital movement, and reduces friction force on the abutment member 81*a* as moving in the other direction along the longitudinal direction of the guide pole 81. That is, a driving force is output from the driver elements 49 to the abutment member 81*a* when the friction force between the driver elements 49 and the abutment member 81*a* increases, thus the ultrasonic actuator 2 moves relative to the abutment member 81*a*. In this embodiment, the ultrasonic actuator 2 moves together with the movable case 82 along the guide pole 81. The longitudinal direction of the guide pole 81 corresponds to the drive direction.

The two driver elements 49 move in orbital paths at a phase shift of 180°. That is, the driving forces are output alternately from the two driver elements 49, thereby causing the ultrasonic actuator 2 to move.

Note that the direction of the driving forces output by the driver elements 49 can be reversed by switching between conditions whether the phase of one drive voltage is advanced or delayed with respect to the phase of the other drive voltage when a phase shift is introduced between the two drive voltages.

[Configuration of Control Section]

Next, the control section 7 will be described. The control section 7 includes a target-position setting section 71, a subtracter 72, a position control section 73, a burst control section 74, a pulse generation section 75, a phase control section 76, a variable delay circuit 77, and a first and a second amplifier sections 78a and 78b. In order to control the focusing-lens drive section 16, the control section 7 provides phase control, which varies the phase difference between the two drive voltages applied to the ultrasonic actuator 2, and wave-number control, which varies the wave number (i.e., the number of pulses) of each voltage wave included in the drive voltages.

The target-position setting section 71 includes a phase-difference computation section 71a, which receives the output signal of the parallax detection section 14, a contrast evaluation section 71b, which receives the output signal of the imaging device 11, a focus-error computation section 71c, which receives the output signals of the phase-difference computation section 71a and the contrast evaluation section 71b, and an AF-algorithm execution section 71d, which receives the output signal of the focus-error computation section 71c. The target-position setting section 71 computes a target position for the focusing lens 15 to focus an object image on the imaging device 11, using either the output signal of the parallax detection section 14 or the output signal of the imaging device 11.

First, a case where a target position for the focusing lens 15 is computed based on the output signal of the parallax detection section 14 will be described. In this case, auto-focusing (hereinafter also referred to as "AF") using the so-called phase-difference detection method is performed.

The phase-difference computation section 71a computes a phase difference based on the output signal from the parallax detection section 14. Specifically, the phase-difference computation section 71a determines a deviation between two distances, one of which is a reference distance between two object images which would be formed on the line sensor when the object images are focused on the imaging device 11, and the other of which is a distance, obtained from the output signal from the line sensor, between two object images which are actually formed on the line sensor.

The focus-error computation section 71c determines whether the focal position is before or after the object plane, and determines how much the focusing lens 15 deviates from the focal position, based on the output signal of the phase-difference computation section 71a (i.e., the aforementioned deviation).

The AF-algorithm execution section 71d computes and outputs the target position for the focusing lens 15 based on the output signal of the focus-error computation section 71c.

Next, a case where the target position for the focusing lens 15 is computed based on the output signal of the imaging device 11 will be described. In this case, AF using the so-called contrast detection method is performed.

The contrast evaluation section 71b computes a contrast value of an object image based on the output signal of the imaging device 11.

The focus-error computation section 71c stores the contrast value computed in the contrast evaluation section 71b, and outputs an output signal for moving the focusing lens 15 over a predetermined small distance to the AF-algorithm execution section 71d. The AF-algorithm execution section 71d computes and outputs the target position for the focusing lens 15 based on the output signal of the focus-error computation section 71c, as described previously.

In this way, in auto-focusing using the contrast detection method, the focusing lens 15 is moved over a small distance in a stepwise manner, then a current contrast value is computed and stored, and lastly the peak of the contrast value is sought. When the peak of the contrast value is found, the focus-error computation section 71c outputs to the AF-algorithm execution section 71d an error between a current position and the position, where the peak of the contrast value is found, of the focusing lens 15. The AF-algorithm execution section 71d computes and outputs the target position for the focusing lens 15 based on the output signal.

As described above, the AF-algorithm execution section 71d outputs a target position for the focusing lens 15 regardless of whether auto-focusing is performed using the phase-difference detection method or the contrast detection method.

The subtracter 72 receives the target position for the focusing lens 15 from the AF-algorithm execution section 71d, and the current position, which represents the actual position of the focusing lens 15 detected by the position detection section 84. The subtracter 72 calculates the deviation between the target and the current positions of the focusing lens 15, and outputs the deviation to the position control section 73.

The position control section 73 computes an amount of phase control to be applied to the drive voltages from the deviation between the target and the current positions of the focusing lens 15, and outputs an output signal depending thereto to the phase control section 76. More specifically, the position control section 73 includes a proportional operation section 73p, an integral operation section 73i, and a derivative operation section 73d, and computes the amount of phase control from the deviation using PID (proportional-integral-derivative) control. More specifically, the proportional term calculated in the proportional operation section 73p are added to the integral term calculated in the integral operation section 73i in a first adder 73a, and the resultant sum is input to a second adder 73b. The second adder 73b also receives the derivative term calculated in the derivative operation section 73d; and a PID value which is obtained by an addition operation of the proportional, integral, and derivative terms is output from the second adder 73b, and input to the phase control section 76. The sum from the first adder 73a is also input to the burst control section 74. Note that the burst control section 74 may be configured to receive only either the proportional term from the proportional operation section 73p or the integral term from the integral operation section 73i, instead of receiving the sum from the first adder 73a.

The burst control section 74 determines the number of pulses included in a predetermined period (hereinafter also referred to as "burst period") based on the sum of the proportional and integral terms from the position control section 73, that is, a parameter associated with the phase difference between the drive voltages. The control operation of the burst control section 74 will be described later.

The pulse generation section 75 is configured to output a pulse signal with a predetermined pulse frequency. Specifically, the pulse generation section 75 outputs pulses, the number of which depends on the output signal from the burst control section 74, in each burst period mentioned above. That is, the pulse generation section 75 groups a pulse group, including one or more pulses, having a duration corresponding to the burst period, into a burst signal, and continuously outputs that burst signal with the burst period. For example, when the burst period corresponds to five pulses, the pulse generation section 75 may output all the five pulses, or may output, for example, only two of the five pulses, depending on the output signal from the burst control section 74. Note that, although the pulses may be output over the entire period of the burst period as described above, the signal is conveniently referred to herein as a "burst signal," including this case. The pulse frequency (i.e., the period of each pulse included in a burst signal) is set to a value near the resonant frequency of stretching and bending vibrations of the actuator body 4 mentioned above. The pulse generation section 75 outputs one of two same signals to the first amplifier section 78a as a first burst signal, and the other to the variable delay circuit 77 as a second burst signal.

The second burst signal input to the variable delay circuit 77 is phase shifted and then output by the variable delay circuit 77.

More specifically, the variable delay circuit 77 also receives the output signal from the phase control section 76. The phase control section 76 determines the amount of phase shift of the second burst signal with respect to the first burst signal based on the output signal from the position control section 73. Then, the phase control section 76 outputs an output signal associated with a phase difference therebetween to the variable delay circuit 77. The variable delay circuit 77 shifts the phase of the second burst signal based on the output signal from the phase control section 76, and provides an output to the second amplifier section 78b.

The first and the second amplifier section 78a and 78b respectively amplify the first and the second burst signals input, and respectively apply the amplified signals as a first and a second drive voltages to the ultrasonic actuator 2. The first and the second drive voltages are respectively applied to the external electrodes 46 and 47 of the actuator body 4.

Thus, when the first and the second drive voltages are applied to the actuator body 4, the actuator body 4 produces composite vibration of stretching vibration and bending vibration, and moves the driver elements 49 in an orbital path. This orbital movement of the driver elements 49 causes the focusing lens 15 held by the holding frame 83 to move along the guide pole 81, together with the movable case 82. A position of the moved focusing lens 15 is detected by the position detection section 84, and is fed back to the subtracter 72.

Figure 8:
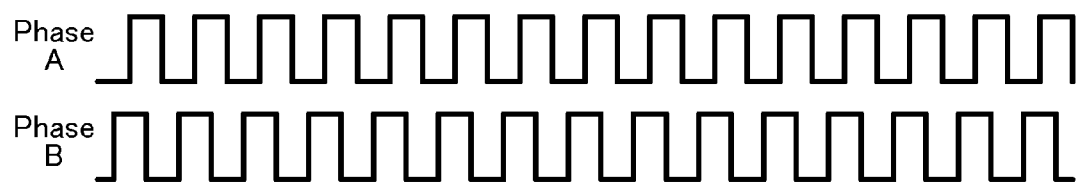
FIG. 8 is a waveform chart of drive voltages at a maximum number of pulses.
Figure 9:
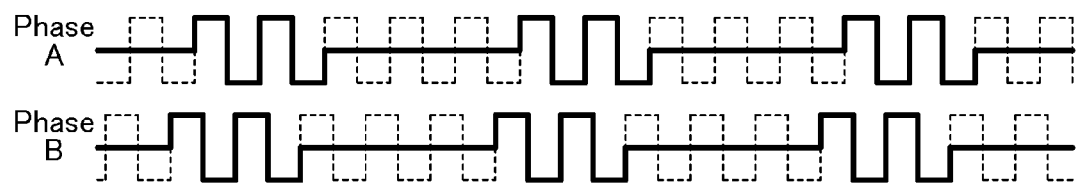
FIG. 9 is a waveform chart of drive voltages when the number of pulses is reduced by 3 per 5 pulses.

Examples of the first and the second drive voltages thus applied to the ultrasonic actuator 2 are shown in FIGS. 8 and 9. The graphs of the first and the second drive voltages shown in FIG. 8 (the phases A and B in the figure represent the first and the second drive voltages, respectively) show that pulses are continuously output during the entire period of the burst period, thereby forming continuous waves as a whole. The second drive voltage has a phase delay of 270° relative to the first drive voltage. In this embodiment, when the first and the second drive voltages have a phase difference of 180°, the actuator body 4 produces only bending vibration, thus the driver elements 49 do not vibrate along the guide pole 81. Therefore, the phases when the first and the second drive voltages have a phase difference of 180° are taken as the reference phases. Then, the driving force of the ultrasonic actuator 2 is adjusted by adjusting the deviation of the phase difference between the first and the second drive voltages with respect to the reference phases. That is, if the reference phases are used, the second drive voltage shown in FIG. 8 can be considered to have a phase delay of 90° relative to the first drive voltage.

The graphs of the first and the second drive voltages shown in FIG. 9 show that two pulses are output in each burst period, thereby forming burst waves each having two pulses output in each burst period as a whole. More specifically, each burst period of the first and the second drive voltages has a first portion in which two pulses are output, and the remaining idle period in which no pulses are output. The second drive voltage has a phase delay of 45° relative to the first drive voltage in this example. Note that in this embodiment, a pair of a positive pulse and a negative pulse are counted as one pulse.

As described above, the control section 7 adjusts the driving force using both phase control, which varies the phase difference between the first and the second drive voltages, and wave-number control, which varies the number of pulses included in the first and the second drive voltages based on the deviation between the current and the target positions of the focusing lens 15. Note that phase control and wave-number control may be provided based on another motion condition such as speed, instead of the position of the focusing lens 15.

Phase control will now be described in detail. In the configuration of the actuator body 4 according to this embodiment, the driving force is at the maximum when the phase difference between the first and the second drive voltages is approximately 90°. That is, a phase difference of approximately 90° provides the best balance between a component of orbital movement of the driver elements 49 in the direction to increase the friction force on the abutment member 81a of the guide pole 81, and a component in the longitudinal direction of the guide pole 81, thereby causing a high driving force to be output. Meanwhile, as the phase difference approaches 180°, the component of the orbital movement of the driver elements 49 in the direction to increase the friction force on the abutment member 81a increases, but in contrast, the component in the longitudinal direction of the guide pole 81 decreases, thereby reducing the amount of movement of each of the driver elements 49 in the longitudinal direction of the guide pole 81, thus the driving force is reduced. Alternatively, as the phase difference approaches 0°, the component of the orbital movement of the driver elements 49 in the longitudinal direction of the guide pole 81 increases, but in contrast, the component in the direction to increase the friction force on the abutment member 81a decreases, thereby reducing the transmissibility of the orbital movement of the driver elements 49 to the abutment member 81a, thus the driving force is reduced. Accordingly, the control section 7 adjusts the driving force by adjusting the phase difference between the first and the second drive voltages in a range of 90° to 270°, using 180° as a reference value. Note that the phase difference may be adjusted in a range of −90° to 90°, using 0° as a reference value.

The phrase "increasing a phase difference" as used herein means adjusting a phase difference so as to approach the phase difference which causes a maximum driving force (90° or 270°, in this embodiment), while the phrase "reducing a phase difference" means adjusting a phase difference so as to approach the phase difference which causes a minimum driving force (180° in this embodiment).

In this phase control, the frequency of a drive voltage remains the frequency which has been set according to a resonant frequency of the actuator body 4 over the entire range of control, and the voltage value of a drive voltage is also maintained at a constant value. As a result, even when a low driving force is to be output, a desired driving force can be properly output. However, even when the phase difference is near 0°, and the driving force is small, the voltage value of the drive voltage is maintained at a constant value, thereby causing high power consumption for a low driving force.

Figure 10:
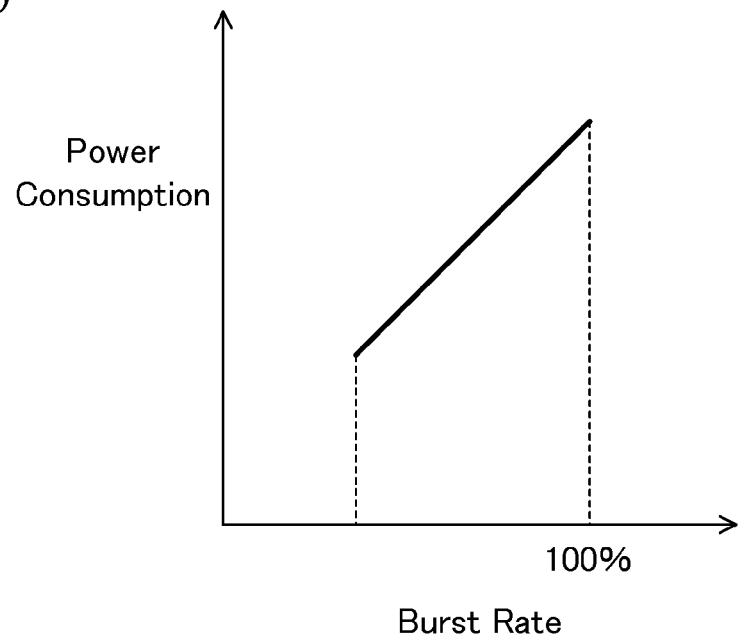
FIG. 10 is a graph illustrating a relationship between a burst rate of a drive voltage and power consumption.
Figure 11:
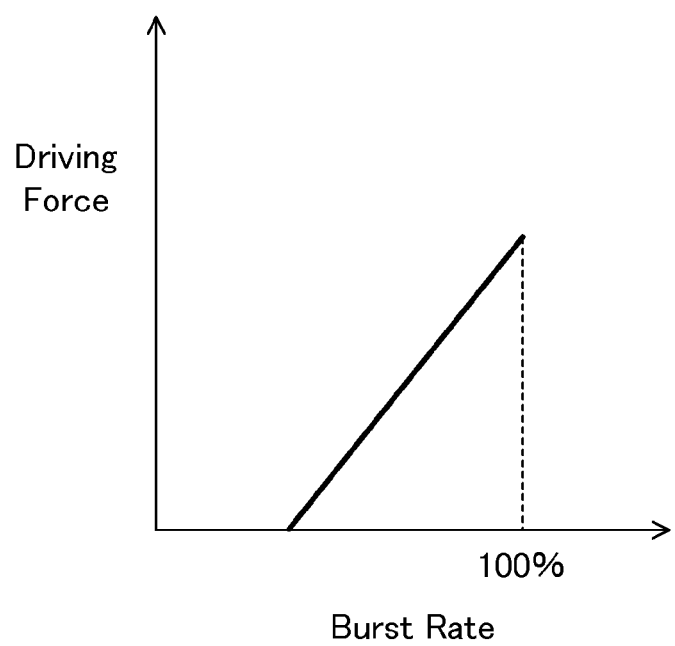
FIG. 11 is a graph illustrating a relationship between a burst rate of a drive voltage and a driving force.

Thus, the control section 7 controls a driving force using phase control and wave-number control in combination. As shown in FIG. 10, a reduction in the number of pulses included in a drive voltage reduces power consumption. A burst rate shown in the figure is a value obtained by dividing the duration summed for all the pulses included in one burst period by the burst period. Specifically, when it is assumed that the burst period corresponds to five pulses, and if one burst period includes five pulses, then the burst rate is 100%; and if one burst period includes one pulse, then the burst rate is 20%. In other words, the control section 7 provides phase control over the first and the second drive voltages, and also reduces power consumption by providing wave-number control. In particular, when a required driving force is small, the actuator body 4 can be properly vibrated even if the number of pulses included in a drive voltage is reduced. However, as shown in FIG. 11, a reduction in the number of pulses included in a burst period causes the driving force to ultimately reach zero before the number of pulses reaches zero (i.e., the burst rate reaches zero). This means that using only wave-number control is not sufficient to properly output a low driving force. Therefore, in wave-number control, the minimum number of pulses included in a burst period is set to a minimum value (two, in this embodiment) with which of pulses the driven components, such as the movable case 82, the holding frame 83, and the focusing lens 15, can be driven. In this embodiment, the control section 7 controls the driving force using phase control utilizing drive signals, which are continuous waves, when a required driving force is relatively large; and controls the driving force using phase control along with adjusting the wave number using wave-number control when a required driving force is relatively small.

Figure 12:
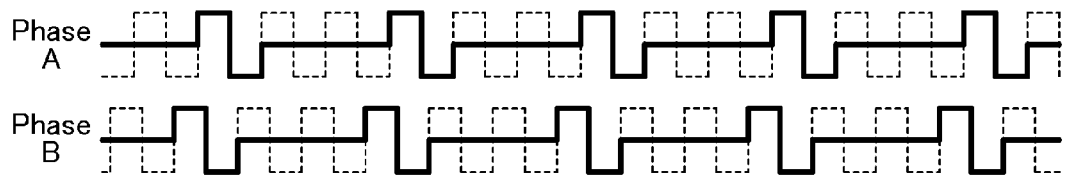
FIG. 12 is a waveform chart of drive voltages in a case where the burst period has been changed.

While, in this embodiment, the minimum number of pulses included in a burst period is set to two, it is not to be construed as limiting to this value. That is, the minimum number of pulses can be changed by adjusting the burst period. For example, as shown in FIG. 12, even if the minimum number of pulses included in a burst period is set to one, the driven components can be driven by setting the burst period to a time period corresponding to three pulses.

In this regard, the minimum number of pulses included in a burst period, or the burst period itself, may be changed between a case where the actuator body 4 is vibrated from a stopped state, and a case where the actuator body 4 has started to vibrate and the vibration is to be maintained. Specifically, the amount of power required to maintain the vibration of the actuator body 4 is lower than the amount of power required to start the actuator body 4 vibrating. Thus, once the actuator body 4 starts to vibrate, the minimum number of pulses included in a burst period can be reduced as compared to when the actuator body 4 starts to vibrate, or the burst period can be set shorter when the number of pulses included in a burst period is set to one. By doing so, power consumption can be further reduced.

In other words, a maximum duration of an idle period in which no pulses are output in a burst period is set to a time period during which the vibration of the actuator body 4 can be maintained. That is, it may be configured such that a next pulse is output after starting the actuator body 4 vibrating by outputting a predetermined number of pulses and a predetermined idle period has elapsed, and before the vibration of the actuator body 4 is completely dampened. If the vibration of the actuator body 4 is allowed to stop, a relatively high voltage and long time is required to start the actuator body 4 vibrating again. Therefore, the actuator body 4 can be continuously vibrated, and hence, the operation of the ultrasonic actuator 2 can be stabilized by setting the maximum duration of the idle period as described above.

In addition, when the movable case 82 is decelerated, the number of pulses may be less than the minimum number of pulses included in a burst period when the movable case 82 is driven. By doing so, power consumption associated therewith can be reduced along with adjusting the deceleration of the movable case 82, hence of the focusing lens 15.

Figure 13:
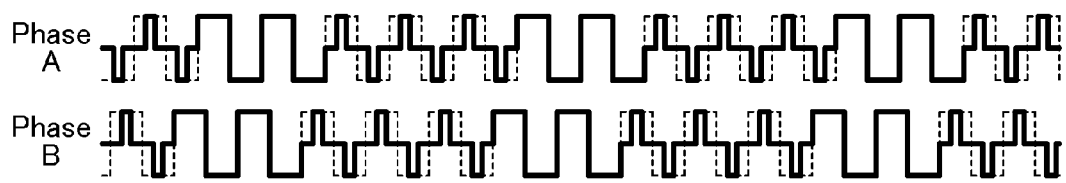
FIG. 13 is a waveform chart of drive voltages in a case where short pulses are output in idle periods.

While it has been described that the first and the second drive voltages are set so as not to output pulses during the idle periods, it is not to be construed as limiting. For example, as shown in FIG. 13, short pulses each having a shorter pulse width than that of the pulses in normal waveform (i.e., pulses each having a predetermined pulse width depending on the pulse period (hereinafter also referred to as "normal pulses")) may be output with the pulse periods even during the idle periods. In this way, outputting short pulses instead of outputting no pulses even in the idle periods allows the actuator body 4 to be supplied with drive voltages although very low. Consequently, the vibration of the actuator body 4 can be maintained, and hence, the orbital movement of the driver elements 49 can be maintained. Thus, even with a configuration in which short pulses are output in the idle periods, since the short pulses have reduced pulse widths, power consumption can be reduced as compared to the case of a continuous wave in which normal pulses are continuously output. In addition, since the burst period can be set longer as compared to the case where no short pulses are output in the idle periods, it may be possible to reduce power consumption depending on the condition.

Figure 14:
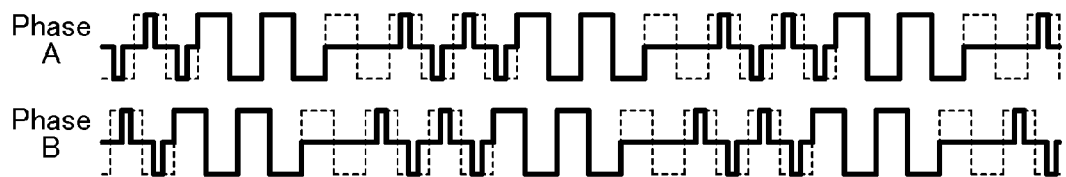
FIG. 14 is a waveform chart of drive voltages in a case where short pulses are output only in latter portions of idle periods.

Moreover, even in a configuration in which short pulses are output in the idle periods, there is no need to output short pulses over the entire idle periods, as shown in FIG. 14. That is, it is sufficient to output only a required number of short pulses needed to maintain the orbital movement of the driver elements 49. In this regard, it is preferable that, as shown in FIG. 14, no short pulses be output in an early portion of each idle period, but a predetermined number of short pulses be output only in a latter portion (that is, short pulses start to be output a predetermined time period (a time period corresponding to the time period needed to output the predetermined number of short pulses) before the end of each idle period). That is, since the vibration of the actuator body 4 is dampened toward the end of each idle period, a drive voltage can be applied at a time when the vibration of the actuator body 4 has been dampened to some degree by outputting short pulses in a latter portion of each idle period. Thus, the short pulses allow the vibration of the actuator body 4 to be maintained more effectively, thereby allowing power consumption to be further reduced. Note that, even in a configuration in which short pulses are output in a latter portion of each idle period, the short pulses do not need to be output if the idle period is short enough for the vibration of the actuator body 4 to be effectively maintained.

[Wave-Number Control]

Figure 15:
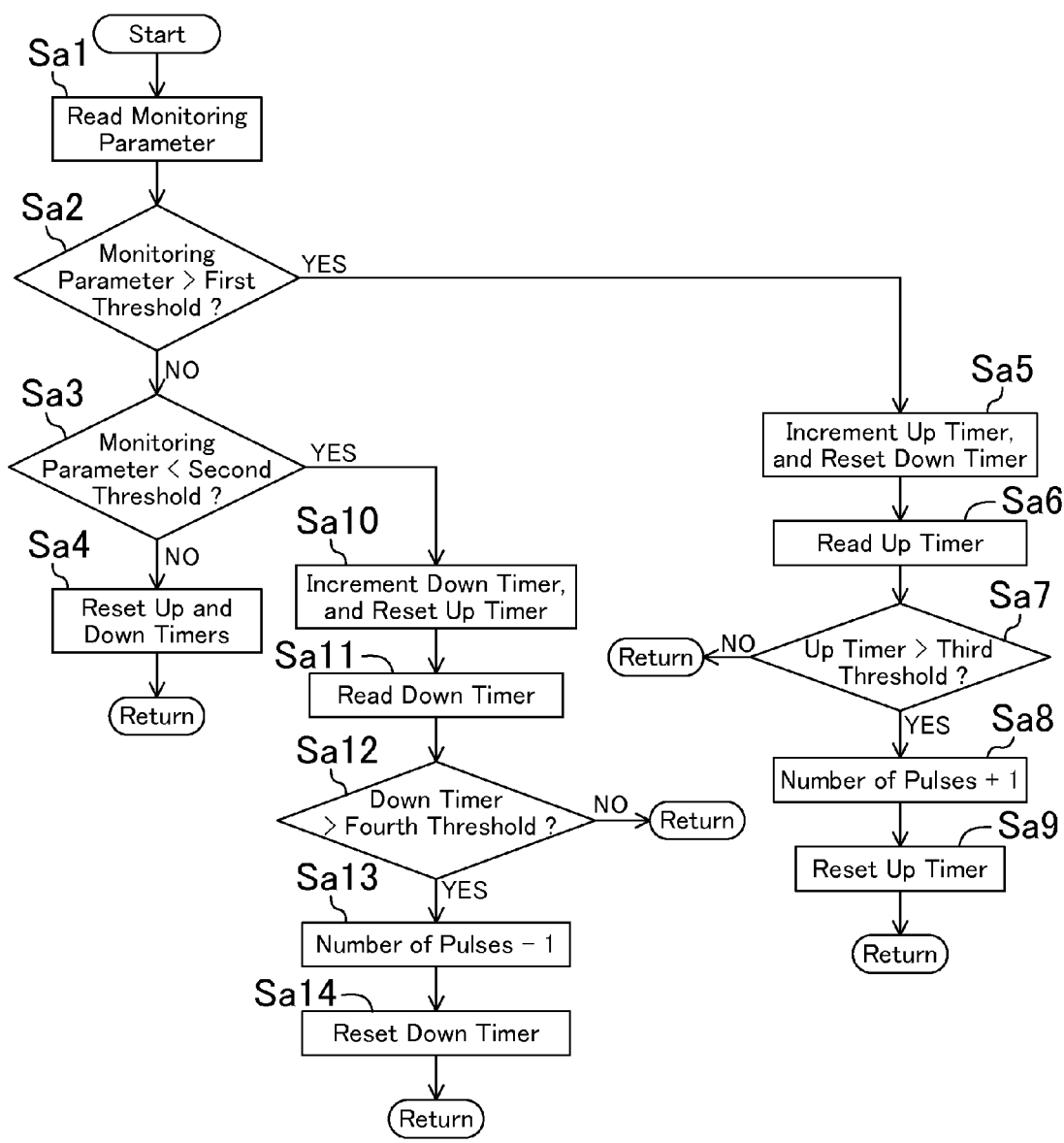
FIG. 15 is a flowchart of wave-number control.

Next, a specific wave-number control provided by the control section 7 will be described in detail with reference to the flowchart of FIG. 15. Specifically, this wave-number control is provided by the burst control section 74.

First, at step Sa1, the monitoring parameter is read. Specifically, the sum of the proportional term and the integral term output from the first adder 73*a* of the position control section 73 is read as the monitoring parameter. This sum is a parameter associated with the phase difference between the first and the second drive signals.

At step Sa2, it is determined whether the monitoring parameter is greater than a predetermined first threshold or not. The first threshold is a value indicative of whether to increase the number of pulses or not. If the monitoring parameter is greater than the first threshold, the process proceeds to step Sa5, while if the monitoring parameter is less than or equal to the first threshold, the process proceeds to step Sa3. At step Sa3, it is determined whether the monitoring parameter is less than a predetermined second threshold or not. The second threshold is a value indicative of whether to decrease the number of pulses or not, and is less than the first threshold. If the monitoring parameter is less than the second threshold, the process proceeds to step Sa10, while if the monitoring parameter is greater than or equal to the second threshold, the process proceeds to step Sa4. At step Sa4, count values of an up timer and a down timer are reset (i.e., set to zero), and then the process returns to step Sa1.

That is, at steps Sa2 and Sa3, it is determined whether the monitoring parameter is between the first and the second thresholds or not, and then, if the monitoring parameter exceeds the first threshold, the process proceeds to step Sa5, and if the monitoring parameter falls below the second threshold, the process proceeds to step Sa10. Then, subsequent control processes are performed accordingly. In addition, if the monitoring parameter is between the first and the second thresholds, the count values of the up and the down timers are reset.

Next, a case where the monitoring parameter is greater than the first threshold will be described. First, at step Sa5, the count value of the up timer is incremented, and the down timer is reset. Then, at step Sa6, the count value of the up timer is read. At step Sa7, it is determined whether the count value of the up timer is greater than a predetermined third threshold or not. If the count value is less than or equal to the third threshold, then the process returns to step Sa1, while if the count value is greater than the third threshold, the process proceeds to step Sa8.

In this regard, if the count value is less than or equal to the third threshold, and the monitoring parameter remains greater than the first threshold, the process once returns to Sa1, passes through steps Sa2, Sa5, and Sa6, and then, proceeds again to step Sa7. This time, since the process has passed step Sa5, the count value of the up timer has been incremented by one. Thus, steps Sa1, Sa2, and Sa5-Sa7 are repeated as long as the monitoring parameter remains greater than the first threshold, and the process proceeds to step Sa8 when the count value of the up timer finally becomes greater than the third threshold. In other words, step Sa7 determines whether the monitoring parameter exceeded the first threshold only temporarily due to noise, etc., or the monitoring parameter has been greater than the first threshold during a time period longer than a predetermined first duration corresponding to the third threshold. The first duration is set to a time period which can be used as a criterion to decide that a changed state is not temporary. The third threshold is set to a value corresponding to the first duration.

Note that, if the monitoring parameter exceeds the first threshold only temporarily, the answer in step Sa2 will be No while steps Sa1, Sa2, and Sa5-Sa7 are repeated (more specifically, when step Sa2 is executed with the monitoring parameter less than or equal to the first threshold), and then, the process will proceed to step Sa3. The up timer is reset at step Sa4 or at step Sa10 after step Sa3.

At step Sa8, based on a decision that the state in which the monitoring parameter exceeds the first threshold is not temporary, but continues for some period of time, the number of drive pulses is incremented by one. After this, at step Sa9, the count value of the up timer is reset, and the process returns to step Sa1.

In this regard, although the down timer is not used when the monitoring parameter is greater than the first threshold, the down timer may be reset at step Sa5. By doing so, even if the monitoring parameter repeatedly exceeds the first threshold and falls below the second threshold every control cycle (i.e., repeating cycle of the flowchart), it can be ensured that the down timer will be incremented from zero, using a procedure described below, when the monitoring parameter becomes less than the second threshold. That is, duration of time during which the monitoring parameter remains less than the second threshold next time can be accurately counted.

Next, a case where the monitoring parameter is less than the second threshold will be described. If it is determined that the monitoring parameter is less than the second threshold at step Sa3, the process proceeds to step Sa10. At step Sa10, the count value of the down timer is incremented, and the up timer is reset.

In this regard, although the up timer is not used when the monitoring parameter is less than the second threshold, the up timer may be reset. By doing so, even if the monitoring parameter repeatedly exceeds the first threshold and falls below the second threshold every control cycle, it can be ensured that the up timer will be incremented from zero when the monitoring parameter becomes greater than the first threshold. That is, duration of time during which the monitoring parameter remains greater than the first threshold next time can be accurately counted.

Next, at step Sa11, the count value of the down timer is read. At step Sa12, it is determined whether the count value of the down timer is greater than a predetermined fourth threshold or not. If the count value is less than or equal to the fourth threshold, then the process returns to step Sa1, while if the count value is greater than the fourth threshold, the process proceeds to step Sa13.

In this regard, if the count value is less than or equal to the fourth threshold, and the monitoring parameter remains less than the second threshold, the process once returns to Sa1, passes through steps Sa2, Sa3, Sa10, and Sa11, and then, proceeds again to step Sa12. This time, since the process has passed step Sa10, the count value of the down timer has been incremented by one. Thus, steps Sa1-Sa3 and Sa10-Sa12 are repeated as long as the monitoring parameter remains less than the second threshold, and the process proceeds to step Sa13 when the count value of the down timer finally becomes greater than the fourth threshold. In other words, step Sa12 determines whether the monitoring parameter fell below the second threshold only temporarily due to noise, etc., or the monitoring parameter has fallen below the second threshold during a time period longer than a predetermined second duration corresponding to the fourth threshold. The second duration is set to a time period which can be used as a criterion to decide that a changed state is not temporary. The fourth threshold is set to a value corresponding to the second duration.

The fourth threshold is set to a value greater than the third threshold. This means that the third threshold is used for cases where the monitoring parameter increases in value, that is, cases where a high driving force is required. When a high driving force is required, it is required to increase the number of pulses with high responsivity, and to rapidly increase the driving force. Accordingly, the third threshold is set to a relatively low value. Meanwhile, the fourth threshold is used for cases where the monitoring parameter decreases in value, that is, cases where a low driving force is required. When the driving force is decreased, not as high rapidity is required as when the driving force is increased. Therefore, the fourth threshold is set to a relatively high value, thereby ensuring to accurately determine whether the state in which the monitoring parameter falls below the second threshold is temporary or not. However, the third and the fourth thresholds may be a same value.

Note that, if the monitoring parameter falls below the second threshold only temporarily, the answer in step Sa3 will be No while steps Sa1-Sa3 and Sa10-Sa12 are repeated (more specifically, when step Sa3 is executed with the monitoring parameter greater than or equal to the second threshold), and then, the process will proceed to step Sa4. The down timer is reset at step Sa4.

At step Sa13, based on a decision that the state in which the monitoring parameter falls below the second threshold is not temporary, but continues for some period of time, the number of drive pulses is decremented by one. After this, at step Sa14, the count value of the down timer is reset, and the process returns to step Sa1.

As described above, in wave-number control, when the monitoring parameter has been greater than the first threshold, which is the upper threshold, during a time period longer than the first duration, the number of pulses is incremented by one. Incrementation of the number of pulses causes the driving force to be increased. If the time period during which the monitoring parameter has been greater than the first threshold is still longer than the first duration even after the incrementation of the number of pulses, the number of pulses is further incremented. In this way, the number of pulses is incremented until the time period during which the monitoring parameter has been greater than the first threshold no longer exceeds the first duration, or until the number of pulses reaches the maximum value (i.e., the drive voltage becomes a continuous wave). Meanwhile, when the monitoring parameter has been less than the second threshold, which is the lower threshold, during a time period longer than the second duration, the number of pulses is decremented by one. Decrementation of the number of pulses causes the driving force to be decreased. If the time period during which the monitoring parameter has been less than the second threshold is still longer than the second duration even after the decrementation of the number of pulses, the number of pulses is further decremented. In this way, the number of pulses is decremented until the time period during which the monitoring parameter has been less than the second threshold no longer falls below the second duration, or until the number of pulses reaches the minimum value (i.e., the minimum number of pulses which can properly vibrate the actuator body 4).

Thus, controlling the number of pulses based on a parameter associated with the phase difference between the first and the second drive signals allows the required driving force to be estimated, and power consumption to be reduced.

In addition, stable control over the number of pulses can be achieved by using the sum of only the proportional term and the integral term, instead of a PID value of PID control, as the parameter associated with the phase difference. Specifically, since the derivative term in a PID value includes high-frequency components, the number of pulses may rapidly vary if the number of pulses is controlled based on a PID value including the derivative term. To the contrary, if the number of pulses is controlled based on the sum of the proportional term and the integral term, variation of the number of pulses can be made smooth, and stable control over the number of pulses can be achieved.

[Starting Control]

Figure 16:
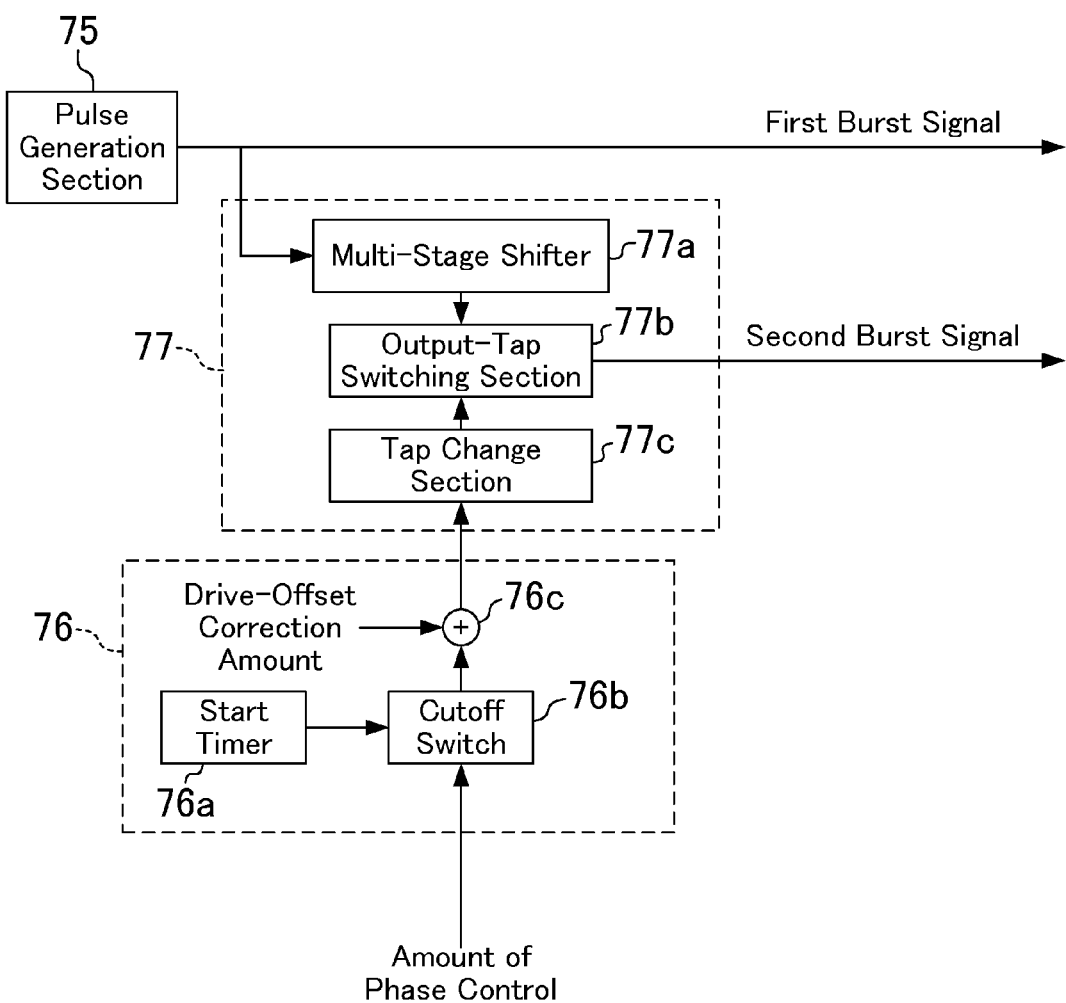
FIG. 16 is a block diagram of a phase control section and a variable delay circuit.
Figure 17:
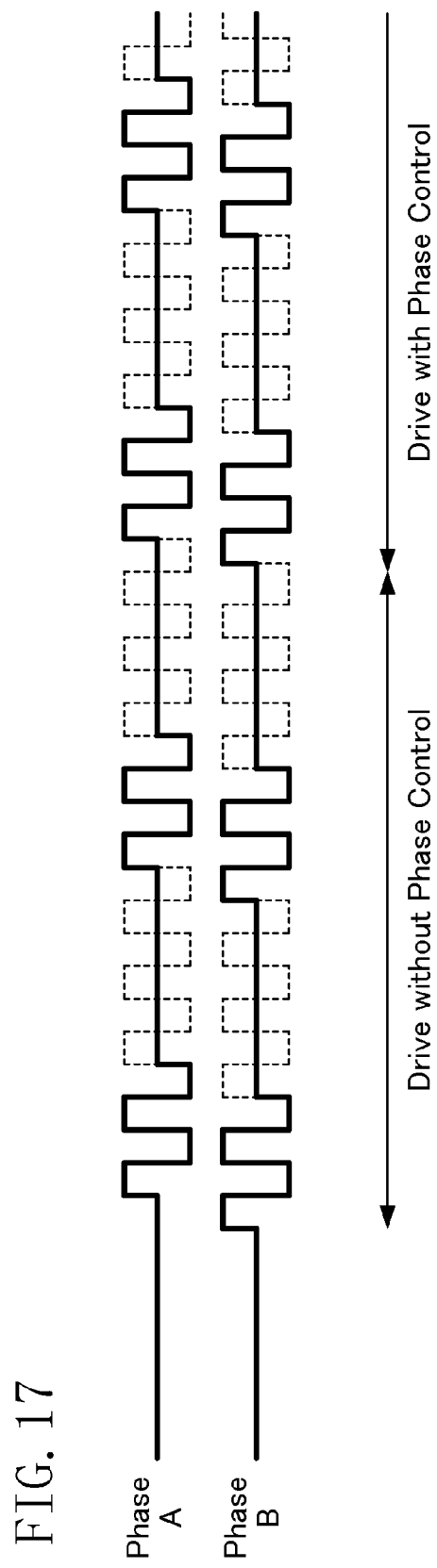
FIG. 17 is a waveform chart of drive voltages in starting control.

In a drive unit with such a configuration, vibration of the actuator body 4 may not be stable, and the driving force may not be properly output immediately after start-up of the actuator body 4. In particular, if start-up is performed using wave-number control with a reduced number of pulses, some amount of time is needed for the vibration of the actuator body 4 to be stabilized. Therefore, the drive unit provides the starting control as described below. This starting control is performed in the phase control section 76 of the control section 7. FIG. 16 is a block diagram of the phase control section 76 and the variable delay circuit 77. FIG. 17 is a waveform chart of drive voltages output by starting control.

The phase control section 76 includes a start timer 76a, a cutoff switch 76b, and an adder 76c.

The start timer 76a starts counting at the time when the actuator body 4 starts up, and outputs an output signal to the cutoff switch 76b a predetermined time after the start-up.

The cutoff switch 76b receives a PID value from the position control section 73, in addition to the output signal from the start timer 76a. The cutoff switch 76b is configured to switch between ON and OFF states depending on the output signal from the start timer 76a. More specifically, the cutoff switch 76b switches to an ON state when an output signal indicating the elapse of a predetermined time is input from the start timer 76a, and outputs a PID value to the adder 76c, while the cutoff switch 76b switches to an OFF state when the output signal is not input, and blocks the output of the PID value to the adder 76c.

The adder 76c receives a drive-offset correction amount, in addition to the PID value. The adder 76c adds the drive-offset correction amount to the PID value, and computes the amount of delay to delay the second burst signal. The adder 76c outputs the computation result to the variable delay circuit 77. The drive-offset correction amount is stored in a memory, etc., and corresponds to a phase difference between the first and the second drive signals, which is required to induce only bending vibration, and not to induce stretching vibration, in the actuator body 4.

The variable delay circuit 77 includes a multi-stage shifter 77a, an output-tap switching section 77b, and a tap change section 77c.

The second burst signal output from the pulse generation section 75 to the variable delay circuit 77 is input to the multi-stage shifter 77a. The second burst signal input to the multi-stage shifter 77a is output from the output tap specified by the output-tap switching section 77b, thereby is output with a phase shift.

The tap change section 77c selects an output tap, of the multi-stage shifter 77a, from which a signal is output based on the input amount of delay, and outputs the selection result as an output signal to the output-tap switching section 77b.

The output-tap switching section 77b switches between output taps of the multi-stage shifter 77a based on the output signal from the tap change section 77c, and outputs the second burst signal having a predetermined amount of phase delay.

When starting control is performed in the phase control section 76 with such a configuration, the first and the second drive voltages appear as shown in FIG. 17. That is, after start-up of the actuator body 4, the phase difference is set to approximately 180° during a predetermined stand-by period, and after the stand-by period has elapsed, phase control with a predetermined phase difference is provided.

More specifically, the cutoff switch 76b of the phase control section 76 is in an OFF state during a time period from start-up of the actuator body 4 until the stand-by period has elapsed. During this period, the adder 76c receives only the drive-offset correction amount, and outputs an amount of delay based only on the drive-offset correction amount to the tap change section 77c. Thus, the second burst signal having an amount of phase delay depending on the drive-offset correction amount is output from the output-tap switching section 77b. The first and the second burst signals are respectively amplified in the first and the second amplifier sections 78a and 78b, and are respectively applied to the external electrodes 46 and 47 of the actuator body 4 as the first and the second drive voltages (denoted respectively as "Phase A" and "Phase B" in the figure) having a phase difference corresponding to the drive-offset correction amount (this phase difference may be zero depending on the configuration of the actuator body 4, etc.). Only bending vibration is induced in the actuator body 4, and the driver elements 49 reciprocate in a direction to press the abutment member 81a of the guide pole 81 (i.e., in a direction orthogonal to the guide pole 81). As a result, no driving forces are output, and the movable case 82, and hence, the focusing lens 15, are not moved.

Meanwhile, after the stand-by period has elapsed after start-up of the actuator body 4, the cutoff switch 76b changes to an ON state, and the adder 76c receives a PID value from the position control section 73. The adder 76c adds the PID value to the drive-offset correction amount, and inputs an amount of delay based on the resultant sum to the tap change section 77c. Thus, the second burst signal having an amount of phase delay depending on the amount of delay is output from the output-tap switching section 77b. In this way, a predetermined phase difference is generated between the first burst signal, which is directly input from the pulse generation section 75 to the first amplifier section 78a, and the second burst signal, which is input from the pulse generation section 75 through the variable delay circuit 77 to the second amplifier section 78b. The first and the second burst signals are respectively amplified in the first and the second amplifier sections 78a and 78b, and are respectively applied to the external electrodes 46 and 47 of the actuator body 4 as the first and the second drive voltages having a predetermined phase difference. Stretching vibration and bending vibration are induced in the actuator body 4 in a coordinated manner, thus the driver elements 49 move in orbital paths, thereby allowing a driving force to be output. As a result, the movable case 82, and hence, the focusing lens 15, are moved.

As described above, starting control controls such that no driving forces are output during a time period from start-up of the actuator body 4 until the stand-by period has elapsed, and the driving force starts to be output after the stand-by period has elapsed. In this regard, the stand-by period is set to a time period for the vibration of the actuator body 4 to be stabilized. By doing so, only bending vibration, which dose not affect driving of the focusing lens 15, is provided during a time period from start-up of the actuator body 4 until the vibration of the actuator body 4 is stabilized. This prevents the focusing lens 15 from being driven when the orbital movement of the driver elements 49 is unstable.

Note that starting control does not necessarily need to be provided with a reduced number of pulses, but may be provided using first and second drive voltages of continuous waves. However, by providing starting control with the number of pulses included in a burst period set to a minimum value, the vibration amplitude can be gradually increased, thereby preventing an unpredictable behavior due to an unstable vibration condition in an early stage after the start of driving.

[Advantage of the First Embodiment]

As described above, according to the first embodiment, controlling a driving force using phase control and wave-number control in combination allows the driving force to be properly output, and power consumption associated therewith can be reduced even when the required driving force is small.

In addition, by adjusting the number of pulses included in a burst period based on the sum of the proportional term and the integral term output from the first adder 73a of the position control section 73, which is a parameter associated with the phase difference used in phase control, the number of pulses can be adjusted by estimating the required driving force. That is, the phase difference used in phase control varies depending on the magnitude of the driving force. Therefore, the driving force can be estimated from the magnitude of the phase difference, and the number of pulses can be adjusted depending on the driving force.

Moreover, usage of the sum of the proportional and integral terms in the position control section 73, which does not include the derivative term having high-frequency components, as the parameter associated with the phase difference, allows for a stable control over the number of pulses.

In wave-number control, the number of pulses is increased when the monitoring parameter is greater than the first threshold, while the number of pulses is decreased when the monitoring parameter is less than the second threshold. In this way, the number of pulses is maintained without change while the monitoring parameter varies between the first threshold, which is the upper threshold, and the second threshold, which is the lower threshold. Therefore, stable wave-number control is achieved.

In addition, the number of pulses is increased when the monitoring parameter has been greater than the first threshold during a time period longer than the first duration, while the number of pulses is decreased when the monitoring parameter has been less than the second threshold during a time period longer than the second duration. In this way, the number of pulses is not changed even when the monitoring parameter exceeds the first threshold or falls below the second threshold temporarily. Therefore, more stable wave-number control is achieved.

Furthermore, only bending vibration is induced in the actuator body 4, thereby providing no driving forces during a time period from start-up of the actuator body 4 until the stand-by period has elapsed, while both stretching vibration and bending vibration are induced in the actuator body 4, thereby providing a driving force, after the stand-by period has elapsed. This prevents the focusing lens 15 from being driven in a situation where the orbital movement of the driver elements 49 is unstable.

[First Variation]

Figure 18:
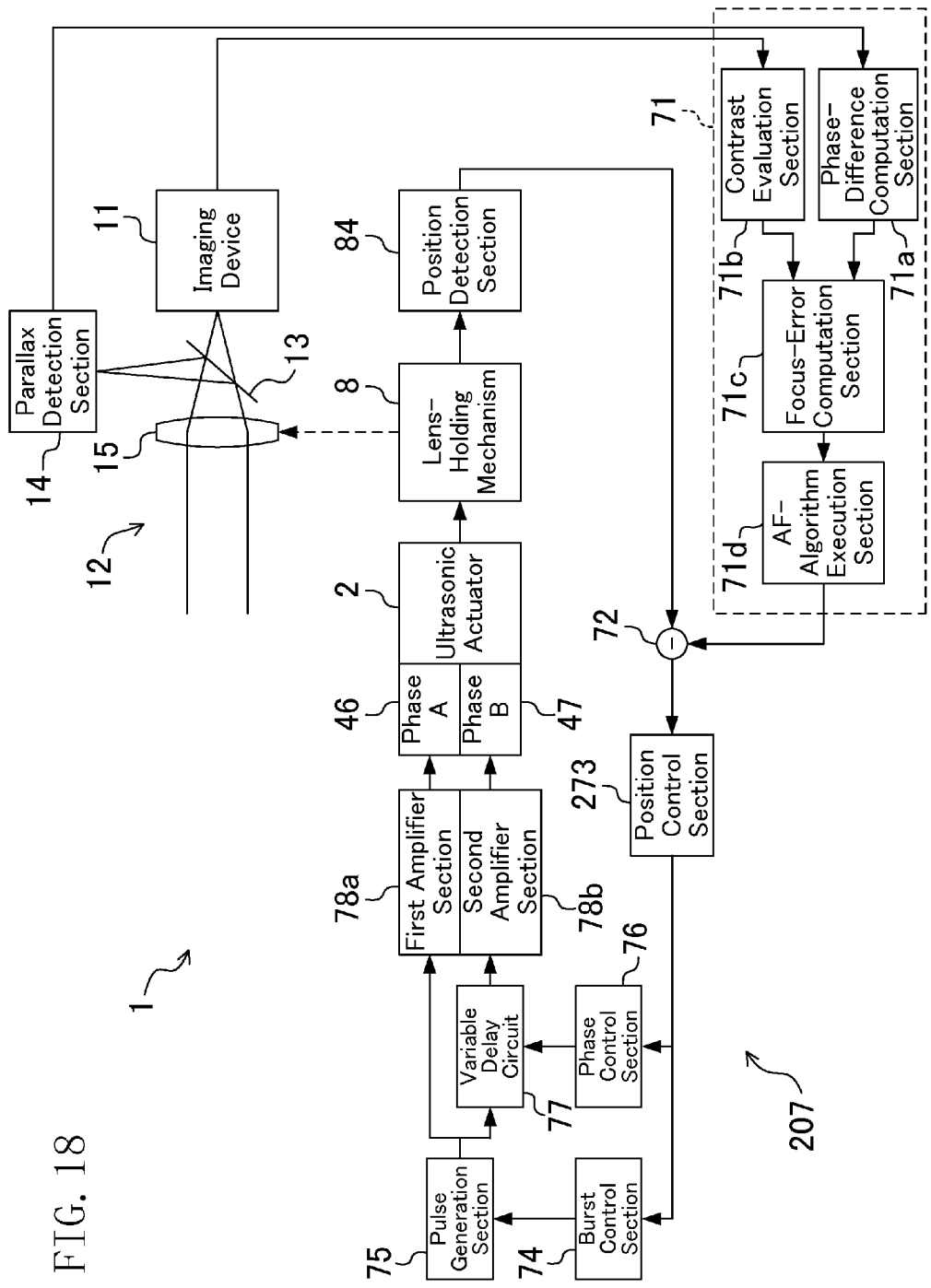
FIG. 18 is a block diagram illustrating a configuration of a camera in accordance with the first variation of the first embodiment.

Next, the first variation of the first embodiment will be described with reference to FIG. 18. FIG. 18 is a block diagram illustrating a control section according to the first variation.

The first variation is different in the configuration of the control section from the first embodiment described previously. Thus, the same reference numerals as those of the first embodiment are used to represent equivalent elements, and the explanation thereof will be omitted.

Comparing with the first embodiment, a position control section 273 of a control section 207 according to the first variation inputs a PID value calculated by PID control to both the burst control section 74 and the phase control section 76.

Even with this configuration, the burst control section 74 can control the number of pulses based on a parameter associated with the phase difference between the first and the second drive voltages. Accordingly, the driving force can be properly output, and power consumption associated therewith can be reduced even when the required driving force is small.

However, since the PID value includes the derivative term having high-frequency components, the first embodiment which controls the number of pulses using the proportional and the integral terms is preferred in the viewpoint of stable control over the number of pulses.

[Second Variation]

Figure 19:
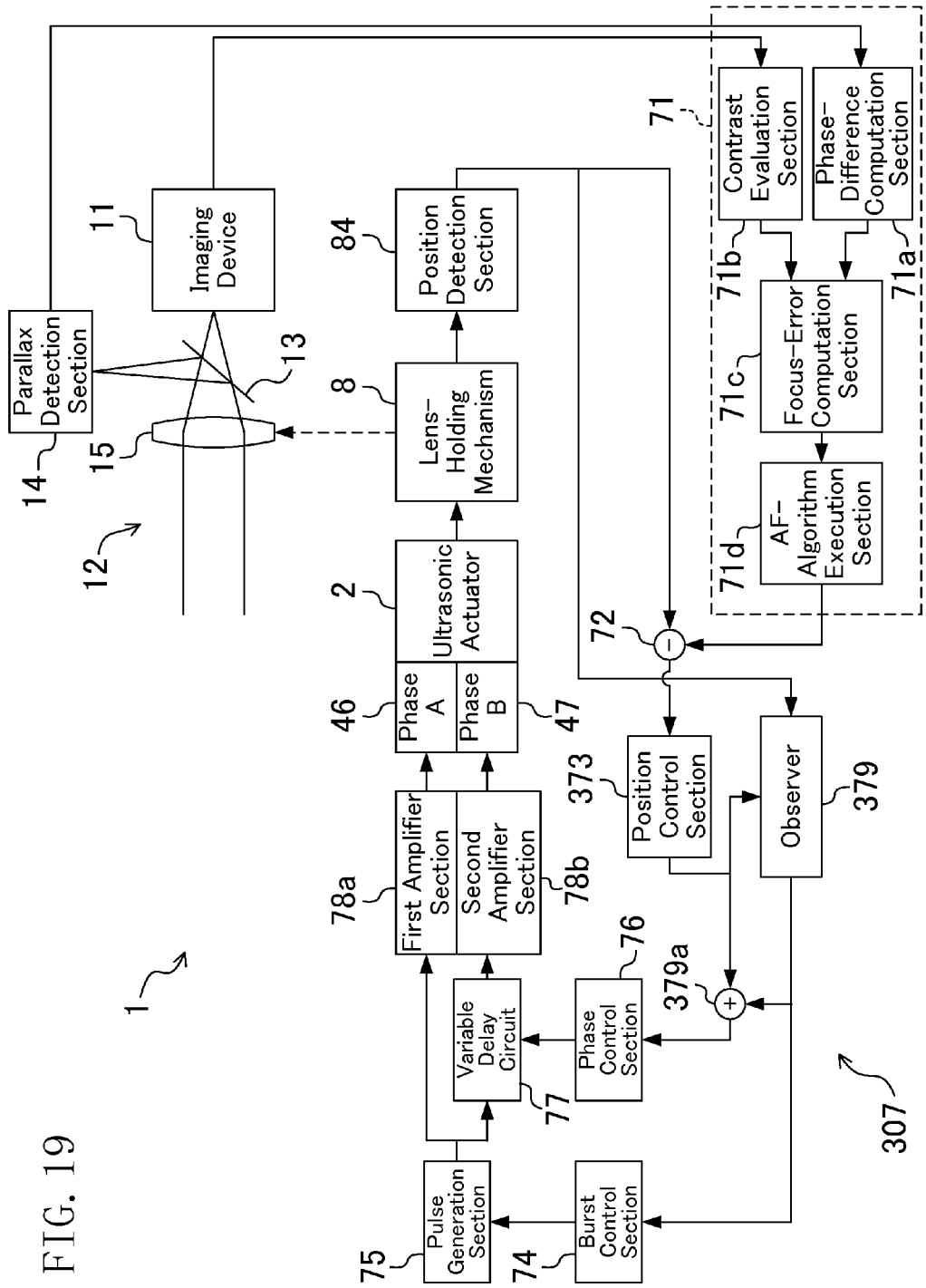
FIG. 19 is a block diagram illustrating a configuration of a camera in accordance with the second variation of the first embodiment.

Next, the second variation of the first embodiment will be described with reference to FIG. 19. FIG. 19 is a block diagram illustrating a control section according to the second variation.

The second variation is different in the configuration of the control section from the first embodiment described previously. Thus, the same reference numerals as those of the first embodiment are used to represent equivalent elements, and the explanation thereof will be omitted.

A position control section 373 of a control section 307 according to the second variation outputs a PID value calculated by PID control similarly to the first variation.

Furthermore, the control section 307 includes an observer 379 designed based on models of the focusing lens 15, the lens-holding mechanism 8, and the ultrasonic actuator 2. The observer 379 receives a current position of the focusing lens 15 from the position detection section 84, and the PID value from the position control section 373. The observer 379 compares an expected operation of the focusing lens 15 according to the model with an operation of the actual focusing lens 15 using both the PID value and the current position of the focusing lens 15, and calculates a correction value to correct the PID value so that the actual focusing lens 15 will operate in a similar manner to that of the model. Specifically, a correction value is output so as to reduce the driving force when the actual focusing lens 15 has moved a distance greater than that of the model, while a correction value is output so as to increase the driving force when the actual focusing lens 15 has moved a distance less than that of the model.

After this, the PID value from the position control section 373 and the correction value from the observer 379 are input to an adder 379*a*, and the sum thereof (i.e., a corrected PID value) is input to the phase control section 76.

In this regard, the burst control section 74 is configured to receive the correction value from the observer 379. The correction value from the observer 379 is also a parameter associated with the phase difference between the first and the second drive voltages, and also varies smoothly. Therefore, the burst control section 74 can provide stable control over the number of pulses.

[Third Variation]

Figure 20:
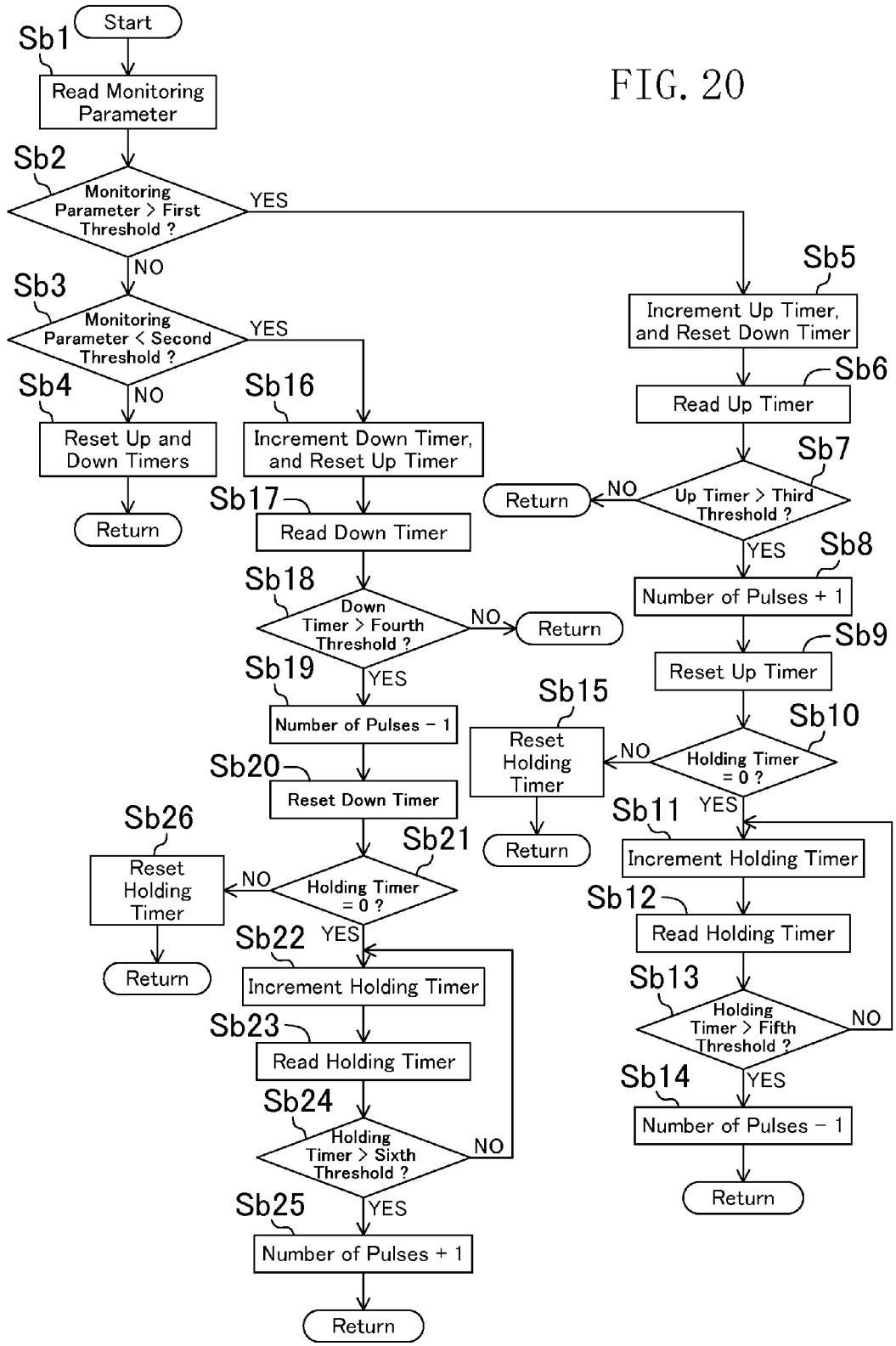
FIG. 20 is a flowchart of wave-number control in accordance with the third variation of the first embodiment.

Next, the third variation of the first embodiment will be described with reference to FIG. 20. FIG. 20 is a flowchart of wave-number control according to the third variation.

The third variation is different in the process of wave-number control from the first embodiment described previously.

In wave-number control of the third variation, although the number of pulses is tentatively increased or decreased when the monitoring parameter has been greater than a predetermined threshold during a time period longer than a predetermined duration, the number of pulses is restored to the original value (value before the increase or decrease) after a predetermined holding time has elapsed. Thereafter, if the monitoring parameter has again been greater than the threshold during a time period longer than the predetermined duration, the number of pulses is ultimately increased or decreased.

More specifically, at steps Sb1-Sb9 in wave-number control of the third variation, it is determined whether or not the monitoring parameter has been greater than a predetermined first threshold during a time period longer than a predetermined first duration (corresponding to a third threshold), and if the answer is Yes, then the number of pulses is incremented by one, and the up timer is reset. Steps Sb1-Sb9 are the same or similar to steps Sa1-Sa9 of the first embodiment. However, the increment in the number of pulses is only tentative in this variation, thus the number of pulses is restored to the original value after a predetermined holding time has elapsed.

More specifically, at step Sb10 (after the up timer is reset), it is determined whether the count value of the holding timer is zero or not. If the count value of the holding timer is zero, the process proceeds to step Sb11, while if the count value of the holding timer is not zero, the process proceeds to step Sb15. At step Sb15, the holding timer is reset and the process returns to Sb1.

At step Sb11, the count value of the holding timer is incremented. At step Sb12, the count value of the holding timer is read, and at step Sb13, it is determined whether the count value is greater than a fifth threshold or not. If the count value is less than or equal to the fifth threshold, the process repeats steps Sb1-Sb13, while if the count value is greater than the fifth threshold, the process proceeds to step Sb14, and then, the number of pulses is decremented by one (i.e., restored to the original value). Thereafter, the process returns to Sb1.

That is, during steps Sb11-Sb14, the state where the number of drive pulses has been incremented by one at step Sb8 is maintained for a predetermined first holding time, corresponding to the fifth threshold; and after the first holding time has elapsed, the number of pulses is restored to the original value.

In this regard, cases where the monitoring parameter increases in value, that is, cases where a higher driving force is required, include a case where the movable case 82 driven by the ultrasonic actuator 2 is obstructed by some foreign object, a case where a foreign object is caught between the driver elements 49 and the abutment member 81*a* of the guide pole 81, a case where a friction force momentarily increases due to irregular movement or manufacturing error of the driver elements 49 and the abutment member 81*a*, etc., many of which are temporary. Therefore, the number of pulses is increased only for the first holding time to increase the driving force, and after the first holding time has elapsed, the number of pulses is restored to the original value. If a higher driving force is only required temporarily, the required driving force is decreased after the first holding time has elapsed. As such, even if the number of pulses is restored to the original value, the monitoring parameter will be less than or equal to the first threshold. In other words, the required driving force can be output with the original number of pulses and the phase difference corresponding to the monitoring parameter less than or equal to the first threshold. Note that the first holding time is set to a time period during which the required driving force is expected to continue to be higher when the required driving force is temporarily increased, and that the fifth threshold is set to a value corresponding to the first holding time.

Meanwhile, a higher driving force may be required not temporary, but continuously. In such a case, even if the monitoring parameter is once reduced to less than or equal to the first threshold by increasing the number of pulses, the monitoring parameter becomes greater than the first threshold again when the number of pulses is restored to the original value. Accordingly, after the process returns from step Sb14 to step Sb1, the process repeats steps Sb1, Sb2, and Sb5-Sb7 described previously, and proceeds to step Sb8, where the number of pulses is incremented by one. Thereafter, the process proceeds through step Sb9 to step Sb10. In this regard, since the holding timer has been incremented in the previous loop at steps Sb11-Sb13, it is determined that the holding timer is not zero at step Sb10, and the process proceeds to step Sb15. At step Sb15, the holding timer is reset, and then, the process returns to step Sb1.

That is, if a higher driving force is required continuously, the monitoring parameter becomes greater than the first threshold, and hence, the process proceeds through steps Sb1, Sb2, and Sb5-Sb7 to step Sb8, where the number of pulses is incremented by one. However, the process does not proceed to steps Sb11-Sb14, but returns to step Sb1. Since the process does not pass through step Sb14 in this case, the number of the pulses incremented by one is maintained. That is, in a case where the number of pulses is once tentatively incremented by one, and restored to the original value, and then, the monitoring parameter has been greater than the first threshold during a time period longer than the first duration again, the number of pulses is ultimately incremented by one, and is not restored to the original value. As a result, an increment of the number of pulses by one causes the driving force to increase. If this driving force is greater than the required driving force, the phase difference is controlled so as to be reduced, thus the monitoring parameter is reduced. Thereafter, if the monitoring parameter is greater than the first threshold even after the driving force is increased due to an incrementation of the number of pulses, the number of pulses is tentatively incremented, and depending on the condition, is ultimately incremented as described previously, since the holding timer has been reset at step Sb15. This tentative or ultimate incrementation of the number of pulses is repeated until the time period during which the monitoring parameter has been greater than the first threshold no longer exceeds the first duration, or until the number of pulses reaches the maximum value (i.e., the drive voltage becomes a continuous wave).

Note that the phrase "not restored to the original value" is used herein to describe that the number of pulses is not purposefully restored to the original value as is done at step Sb14; and is not intended to mean that the number of pulses is not decremented any more even after the monitoring parameter decreases in value. That is, if the monitoring parameter decreases in value thereafter, it is possible that the number of pulses is decremented by the process at and after step Sb16, which will be described later.

While the cases where the monitoring parameter increases in value have been described, the number of pulses is also controlled in a similar way in cases where the monitoring parameter decreases in value.

More specifically, at steps Sb1-Sb3 and Sb16-Sb20, it is determined whether or not the monitoring parameter has been less than a predetermined second threshold during a time period longer than a predetermined second duration (corresponding to a fourth threshold), and if the answer is Yes, then the number of pulses is decremented by one, and the down timer is reset. Steps Sb1-Sb3 and Sb16-Sb20 are the same or similar to steps Sa1-Sa3 and Sa10-Sa14 of the first embodiment. However, the decrement in the number of pulses is only tentative in this variation, thus the number of pulses is restored to the original value after a predetermined holding time has elapsed.

Specifically, at step Sb21 (after the down timer is reset), it is determined whether the count value of the holding timer is zero or not. If the count value of the holding timer is zero, the process proceeds to step Sb22, while if the count value of the holding timer is not zero, the process proceeds to step Sb26. At step Sb26, the holding timer is reset and the process returns to Sb1.

At step Sb22, the count value of the holding timer is incremented. At step Sb23, the count value of the holding timer is read, and at step Sb24, it is determined whether the count value is greater than a sixth threshold or not. If the count value is less than or equal to the sixth threshold, the process repeats steps Sb22-Sb24, while if the count value is greater than the sixth threshold, the process proceeds to step Sb25, and then, the number of pulses is incremented by one (i.e., restored to the original value). Thereafter, the process returns to Sb1.

That is, during steps Sb22-Sb25, the state where the number of drive pulses has been decremented by one at step Sb19 is maintained for a predetermined second holding time, corresponding to the sixth threshold; and after the second holding time has elapsed, the number of pulses is restored to the original value.

In this regard, cases where the monitoring parameter decreases in value, that is, cases where a lower driving force is required, include a case where after the movable case 82 driven by the ultrasonic actuator 2 is obstructed by some foreign object, the obstruction is removed, and hence, the load is suddenly reduced, a case where a friction force momentarily decreases due to irregular movement or manufacturing error of the driver elements 49 and the abutment member 81a, etc., many of which are temporary. Therefore, the number of pulses is decreased only for the second holding time to reduce the driving force, and after the second holding time has elapsed, the number of pulses is restored to the original value. If a lower driving force is only required temporarily, the required driving force is increased after the second holding time has elapsed. As such, even if the number of pulses is restored to the original value, the monitoring parameter will be greater than or equal to the second threshold. In other words, the required driving force can be output with the original number of pulses and the phase difference corresponding to the monitoring parameter greater than or equal to the second threshold. Note that the second holding time is set to a time period during which the required driving force is expected to continue to be lower when the required driving force is temporarily decreased, and that the sixth threshold is set to a value corresponding to the second holding time.

Meanwhile, a lower driving force may be required not temporary, but continuously. In such a case, even if the monitoring parameter is once increased to more than or equal to the second threshold by reducing the number of pulses, the monitoring parameter becomes less than the second threshold again when the number of pulses is restored to the original value. Accordingly, after the process returns from step Sb25 to step Sb1, the process repeats steps Sb1-Sb3 and Sb16-Sb18 described previously, and proceeds to step Sb19, where the number of pulses is decremented by one. Thereafter, the process proceeds through step Sb20 to step Sb21. In this regard, since the holding timer has been incremented in the previous loop at steps Sb22-Sb24, it is determined that the holding timer is not zero at step Sb21, and the process proceeds to step Sb26. At step Sb26, the holding timer is reset, and then, the process returns to step Sb1.

That is, if a lower driving force is required continuously, the monitoring parameter becomes less than the second threshold, and hence, the process proceeds through steps Sb1-Sb3 and Sb16-Sb18 to step Sb19, where the number of pulses is decremented by one. However, the process does not proceed to steps Sb22-Sb25, but returns to step Sb1. Since the process does not pass through step Sb25 in this case, the number of pulses decremented by one is maintained. That is, in a case where the number of pulses is once tentatively decremented by one, and restored to the original value, and then, the monitoring parameter has been less than the second threshold during a time period longer than the second duration again, the number of pulses is ultimately decremented by one, and is not restored to the original value (the phrase "not restored to the original value" is used herein to describe that the number of pulses is not purposefully restored to the original value, as described previously). As a result, a decrement of the number of pulses by one causes the driving force to decrease. If this driving force is less than the required driving force, the phase difference is controlled so as to be increased, thus the monitoring parameter is increased. Thereafter, if the monitoring parameter is less than the second threshold even after the driving force is decreased due to a decrementation of the number of pulses, the number of pulses is tentatively decremented, and depending on the condition, is ultimately decremented as described previously, since the holding timer has been reset at step Sb26. This tentative or ultimate decrementation of the number of pulses is repeated until the time period during which the monitoring parameter has been less than the second threshold no longer falls below the second duration, or until the number of pulses reaches the minimum value.

As described above, in the third variation, if the number of pulses needs to be increased or decreased, the number of pulses is first increased or decreased tentatively, and is restored to the original value to see if the pulse number needs to be changed, and then, the number of pulses is ultimately increased or decreased if the number of pulses needs to be increased or decreased again. This approach prevents a control result of the number of pulses from oscillating due to temporality of a need to increase or decrease of the number of pulses.

Second Embodiment

Next, the second embodiment will be described.

The second embodiment is different in the method of wave-number control from the first embodiment. Thus, the same reference numerals as those of the first embodiment are used to represent equivalent elements, and the explanation thereof will be omitted.

In the second embodiment, the burst control section 74 has a map defining a relationship between the value of the monitoring parameter and the number of pulses. The burst control section 74 determines the number of pulses based on the monitoring parameter input and the map, and outputs an output signal depending on the number of pulses to the pulse generation section 75.

Figure 21:
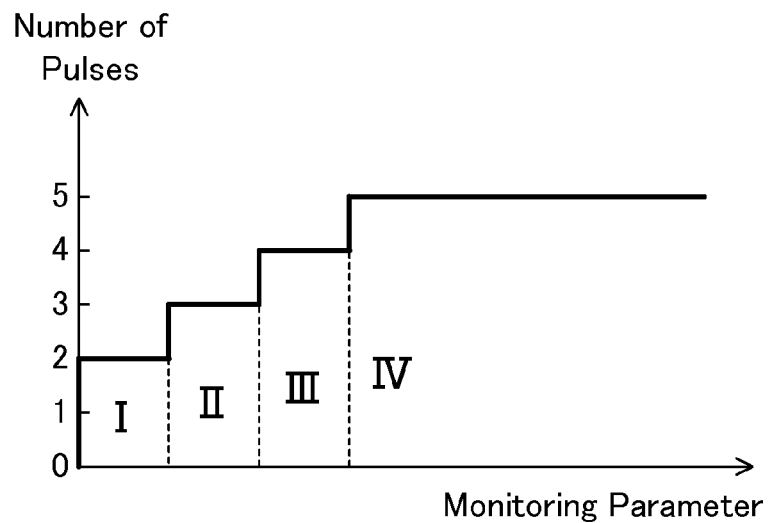
FIG. 21 is a map defining a relationship between a monitoring parameter and the number of pulses in a drive unit in accordance with the second embodiment.

More specifically, as shown in FIG. 21, the map has a plurality of regions each associated with a value of the monitoring parameter, and the number of pulses is assigned to each region such that the number of pulses increases as the value of the monitoring parameter increases. For example, the burst control section 74 sets the number of pulses to "3" when the monitoring parameter is within the second region II, and sets the number of pulses to "4" when the monitoring parameter is within the third region III, and then, outputs an output signal accordingly.

In this way, a map defining a relationship between the value of the monitoring parameter and the number of pulses allows the monitoring parameter and the number of pulses to be quickly switched with the same timing. In particular, power consumption can be quickly reduced when the required driving force is small.

Note that a map does not necessarily need to exist. As in the second variation described later, any configuration may be applied as long as the number of pulses is determined based on the value of the monitoring parameter, one example of which is to divide the value of the monitoring parameter by a predetermined region division width, and thereby determining the number of pulses based on the division result.

[First Variation]

Figure 22:
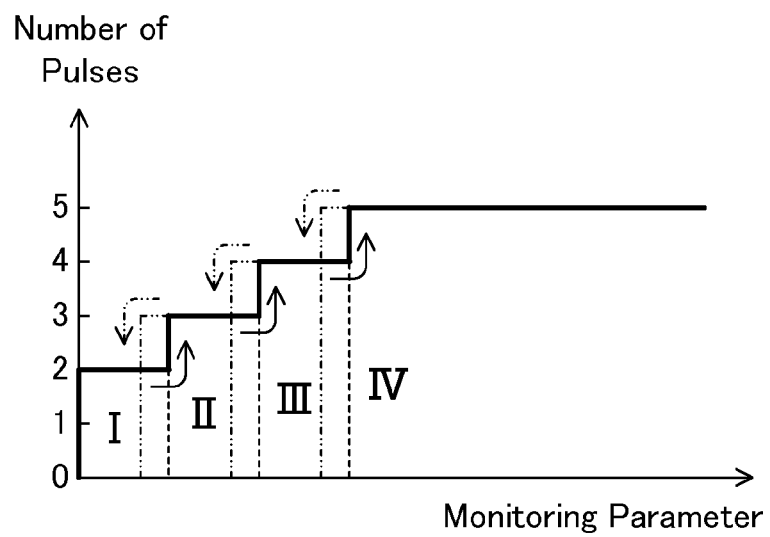
FIG. 22 is a map defining a relationship between a monitoring parameter and the number of pulses in accordance with the first variation of the second embodiment.

As shown in FIG. 22, different maps may be used for a case where the monitoring parameter is increasing, and for a case where the monitoring parameter is decreasing.

For example, if the monitoring parameter has increased from a value in the second region II to a value in the third region III, the number of pulses increases from three to four correspondingly. Thus, an increase in the number of pulses causes the available driving force to increase by the amount corresponding to the increase in the number of pulses. Therefore, if the required driving force remains the same, the required phase difference decreases, and the monitoring parameter also decreases accordingly. After this, if the monitoring parameter decreases to the second region II, then the number of pulses decreases from four to three correspondingly. Thus, a decrease in the number of pulses causes the available driving force to decrease by the amount corresponding to the decrease in the number of pulses. Therefore, even if the required driving force is the same as before the decrease in the number of pulses, the required phase difference increases, and the monitoring parameter also increases accordingly. When the monitoring parameter increases to the third region III, then the number of pulses increases from three to four correspondingly as described above. In this way, the number of pulses may repeatedly increase and decrease across a boundary between regions to which different numbers of pulses are assigned, which may cause a control result of the monitoring parameter and the number of pulses to oscillate.

Thus, the map for a case where the parameter decreases in value defines each lower limit of the monitoring parameter in the regions to which the corresponding numbers of pulses are assigned, below each lower limit in the map for a case where the parameter increases in value. With this approach, even when the monitoring parameter slightly decreases with a decrease of the phase difference due to an increase in the number of pulses, the monitoring parameter does not fall within the next region, where one smaller number is assigned for the number of pulses, but still falls within the region where the increased number of pulses is assigned. This is because the lower limit of each region of the monitoring parameter is set relatively low in the map for a case where the parameter decreases in value. In a similar way, even when the monitoring parameter slightly increases with an increase of the phase difference due to a decrease in the number of pulses, the monitoring parameter does not fall within the next region, where one larger number is assigned for the number of pulses, but still falls within the region where the decreased number of pulses is assigned. This is because the upper limit of each region of the monitoring parameter is set relatively high in the map for a case where the parameter increases in value. Thus, a control result of the monitoring parameter and the number of pulses can be prevented from oscillating.

[Second Variation]

Figure 23:
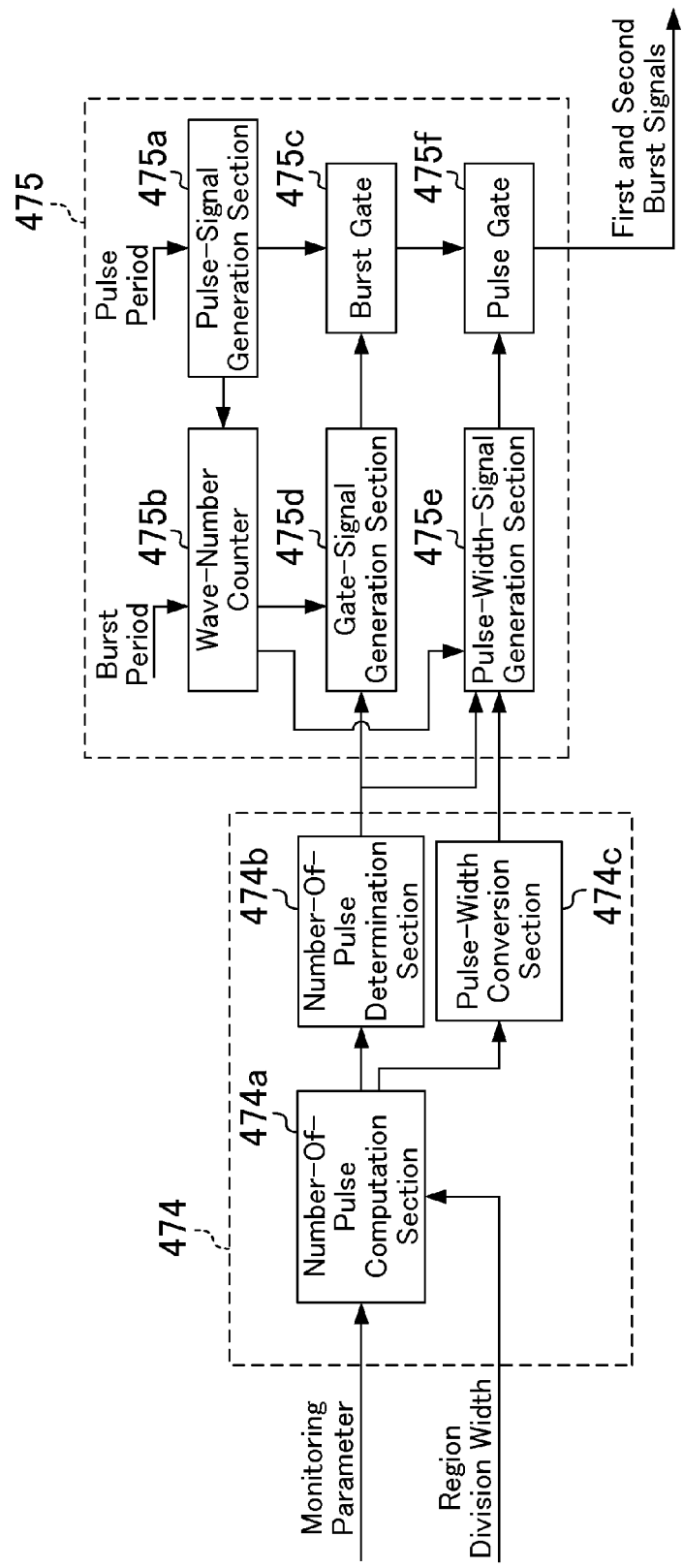
FIG. 23 is a block diagram of a burst control section and a pulse generation section.

Next, a control unit according to the second variation will be described with reference to FIG. 23. FIG. 23 is a block diagram of a burst control section and a pulse generation section.

Wave-number control according to the second variation determines the number of pulses based on the value of the monitoring parameter, and also controls the pulse width of at least one output pulse based on the value of the monitoring parameter. That is, this wave-number control outputs normal pulses and at least one pulse (hereinafter also referred to as "variable pulse") having a pulse width shorter than the pulse width of a normal pulse in combination.

A burst control section 474 according to the second variation includes a number-of-pulse computation section 474*a*, a number-of-pulse determination section 474b, and a pulse-width conversion section 474c.

The number-of-pulse computation section 474a receives the monitoring parameter and a region division width stored in a memory. The region division width corresponds to the width of the regions of the monitoring parameter, to which the corresponding numbers of pulses are assigned in the map (see FIG. 21). The number-of-pulse computation section 474a divides the monitoring parameter by the region division width, and outputs the integer part of the computation result to the number-of-pulse determination section 474b, and outputs the fraction part thereof to the pulse-width conversion section 474c.

The number-of-pulse determination section 474b determines the number of pulses based on the integer part input from the number-of-pulse computation section 474a. Specifically, the number-of-pulse determination section 474b adds "1" to the integer part to obtain the number of pulses.

The pulse-width conversion section 474c determines the pulse width of variable pulses based on the fraction part input from the number-of-pulse computation section 474a. Specifically, the pulse-width conversion section 474c determines the pulse width in proportion to the fraction part, with the pulse width of normal pulses taken as "1." For example, if the value of the fraction part is 0.5, the pulse-width conversion section 474c sets the pulse width to ½ of the pulse width of normal pulses. Note that the relationship between the value of the fraction part and the pulse width is not limited to a proportional relation.

Thus, the output signal output from the number-of-pulse determination section 474b and the output signal output from the pulse-width conversion section 474c are input to a pulse generation section 475.

Figure 24A:
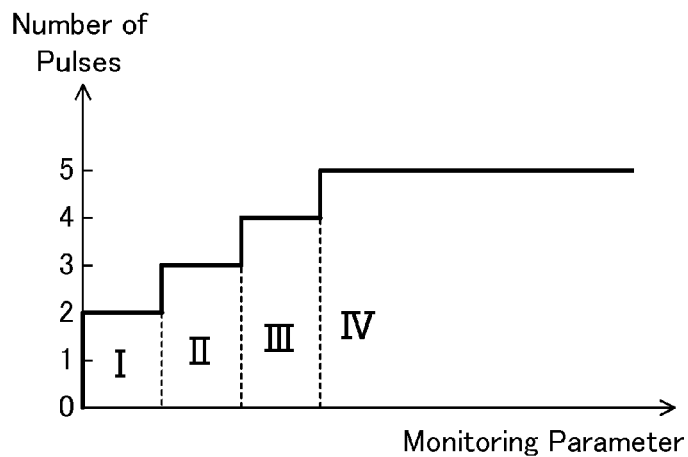
FIGS. 24A and 24B are maps defining relationships between a monitoring parameter and either the number of pulses or the pulse width in accordance with the second variation of the second embodiment.
Figure 24B:
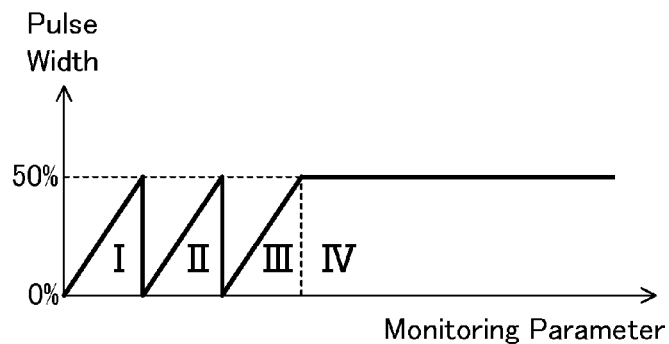

While the above description has been directed to the second variation in which the number of pulses and the pulse width of variable pulse are determined, respectively, based on the integer part and on the fraction part of the value obtained by dividing the monitoring parameter by the region division width, it is not to be construed as limiting. For example, as shown in FIGS. 24A and 24B, there may be a map defining the relationship between the number of pulses and the monitoring parameter (see FIG. 24A), and a map defining the relationship between the pulse width and the monitoring parameter (see FIG. 24B); and the number of pulses and the pulse width of variable pulse may be determined using the both maps.

The pulse generation section 475 includes a pulse-signal generation section 475a, a wave-number counter 475b, a burst gate 475c, a gate-signal generation section 475d, a pulse-width-signal generation section 475e, and a pulse gate 475f.

The pulse-signal generation section 475a receives a pulse period, and generates a continuous wave of pulses output with this pulse period. The continuous wave of pulses output from the pulse-signal generation section 475a is input to both the wave-number counter 475b and the burst gate 475c.

The wave-number counter 475b receives a burst period, in addition to the continuous wave of pulses. The wave-number counter 475b counts the number of pulses included in the continuous wave, and outputs an output signal for each count of a pulse to both the gate-signal generation section 475d and the pulse-width-signal generation section 475e. In doing so, when counting the first pulse of each burst period, the wave-number counter 475b outputs an output signal different from those output when the other pulses are counted.

The gate-signal generation section 475d receives the output signal from the number-of-pulse determination section 474b, in addition to the output signal from the wave-number counter 475b; and generates and outputs an output signal to control the burst gate 475c. The gate-signal generation section 475d outputs a signal to turn on the burst gate 475c during a time period from the first pulse of each burst period until the number of pulses associated with the output signal from the number-of-pulse determination section 474b are counted.

The burst gate 475c outputs the continuous wave input from the pulse-signal generation section 475a only for a time period associated with the output signal from the gate-signal generation section 475d. This ensures that as many pulses as a number determined in the number-of-pulse determination section 474b are output every burst period from the burst gate 475c.

The pulse-width-signal generation section 475e receives, in addition to the output signal from the wave-number counter 475b, the output signal from the number-of-pulse determination section 474b and the output signal from the pulse-width conversion section 474c; and generates and outputs an output signal to control the pulse gate 475f. The pulse-width-signal generation section 475e determines a timing to output the last pulse of each burst period using both the output signal from the wave-number counter 475b and the output signal from the number-of-pulse determination section 474b; and outputs at that timing a signal to turn on the pulse gate 475f only for a time period corresponding to the pulse width associated with the output signal from the pulse-width conversion section 474c.

The pulse gate 475f receives the output signal from the burst gate 475c in addition to the output signal from the pulse-width-signal generation section 475e, adjusts the pulse width of the output signal from burst gate 475c, and provides an output. Specifically, the pulse gate 475f adjusts the pulse width of a pulse, which passes through at the timing corresponding to the output signal from the pulse-width-signal generation section 475e, included in the pulse group input from the burst gate 475c, to a pulse width corresponding to the output signal. This allows as many pulses as a number determined in the number-of-pulse determination section 474b, having the pulse width of the last pulse adjusted, to be output from the pulse gate 475f every burst period.

Figure 25:
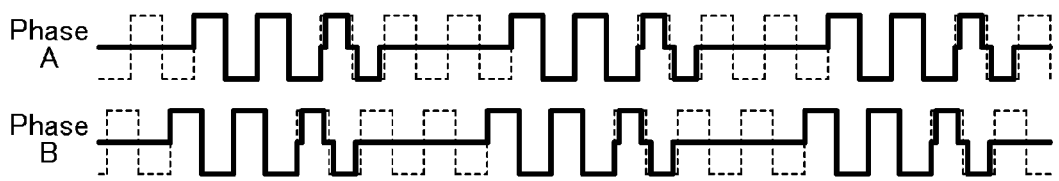
FIG. 25 is a waveform chart of drive voltages in a case where normal pulses and variable pulses are used in combination.

In this way, as shown in FIG. 25, the pulse generation section 475 outputs a burst signal including a combination of one or more normal pulses and a variable pulse with an adjusted pulse width depending on the value of the monitoring parameter every burst period. The sum of pulse widths of the pulses included in a burst signal output as described above is proportional to the value of the monitoring parameter. Note that the variable pulse does not necessarily need to be output after the normal pulses, but may be output before or between the normal pulses.

As described above, determination the number of pulses and the pulse width based on the value of the monitoring parameter allows the monitoring parameter and the number of pulses and the pulse width to be quickly switched with the same timing. In particular, power consumption can be quickly reduced when the required driving force is small. In addition, by changing not only the number of pulses but also the pulse width based on the value of the monitoring parameter, the driving force can be continuously adjusted in magnitude. That is, while the number of pulses is changed only discretely, the pulse width can be changed continuously, thereby allowing the driving force to be adjusted continuously in magnitude by adjusting the number of pulses and the pulse width in combination.

Third Embodiment

Figure 26:
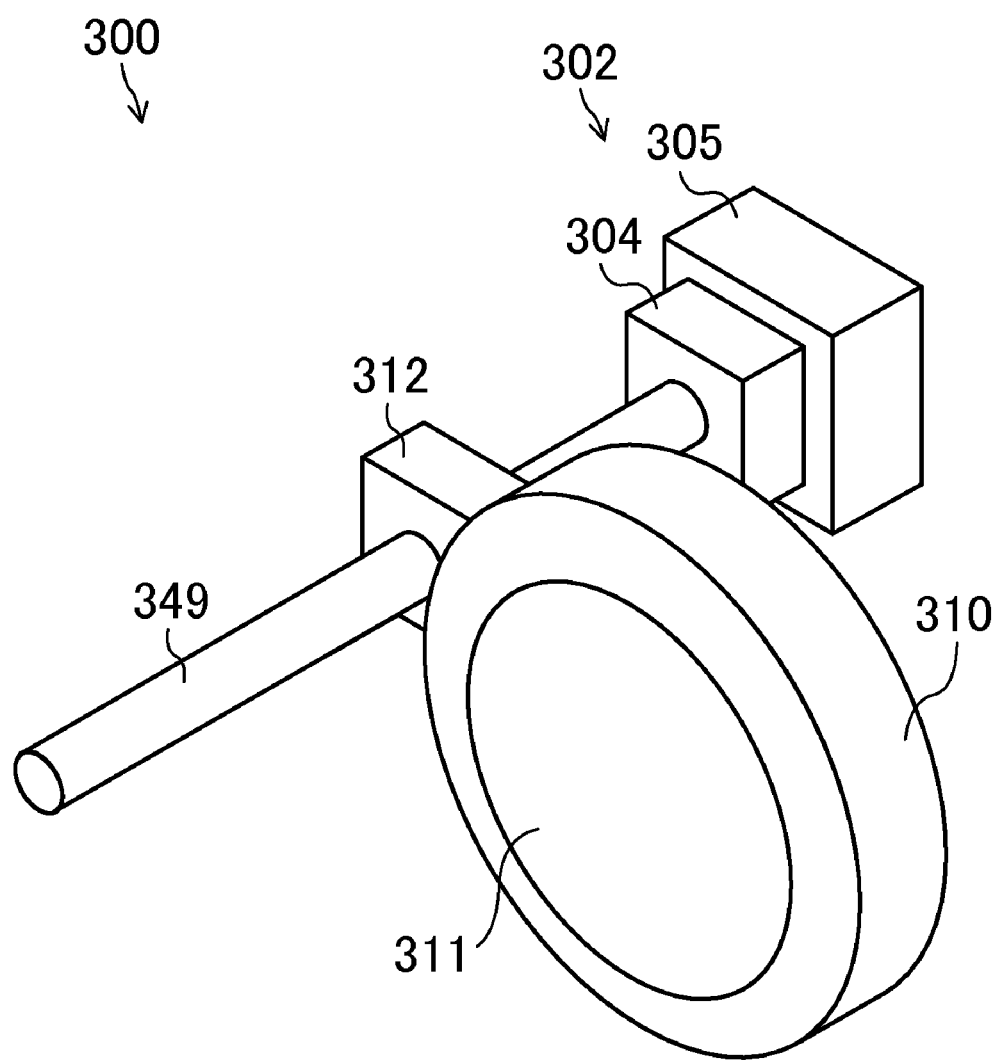
FIG. 26 is a perspective view of a part of a lens mechanism of a camera in accordance with the third embodiment.

Next, a drive unit according to the third embodiment will be described with reference to FIGS. 26 and 27A-27B. FIG.

26 is a perspective view of a part of a lens mechanism 300 of a camera, and FIGS. 27A and 27B are schematic side views of an ultrasonic actuator 302.

The third embodiment is different in the configuration of the ultrasonic actuator 302 from the first embodiment. Thus, the same reference numerals as those of the first embodiment are used to represent equivalent elements, and the explanation thereof will be omitted.

The lens mechanism 300 includes a lens frame 310, a lens 311 held by the lens frame 310, and an ultrasonic actuator 302 attached to an attachment section 312 of the lens frame 310. The lens frame 310 is driven by the ultrasonic actuator 302 along the optical axis.

The ultrasonic actuator 302 includes an actuator body 304, which generates vibration, an anchor weight 305 attached to one end of the actuator body 304, and a drive shaft 349 attached to the other end of the actuator body 304.

The actuator body 304 is a piezoelectric element, and is formed by alternately stacking piezoelectric element layers 341 and internal electrode layers (not shown). The internal electrode layers include a first group of electrode layers and a second group of electrode layers. The first group of electrode layers and the second group of electrode layers are arranged alternately in a stacked manner with the piezoelectric element layers 341. Specifically, the piezoelectric element layers 341 are each interposed between a corresponding pair of the first group and the second group of electrode layers in the thickness direction. The piezoelectric element layers 341 are each electrically polarized in the thickness direction, for example, from the first group to the second group of electrode layers. That is, each two adjacent piezoelectric element layers 341 are polarized in opposite directions along the thickness direction. Applying voltage to the first group and the second group of electrode layers causes each of the piezoelectric element layers 341 to expand and contract in the thickness direction. In this regard, although each two adjacent piezoelectric element layers 341 are in opposite relative positions to the first group and the second group of electrode layers, the directions of polarization are also opposite. As a result, applying voltage to the first group and the second group of electrode layers does not cause expanding piezoelectric element layers 341 and contracting piezoelectric element layers 341 to co-occur in the actuator body 304, but causes the actuator body 304 to expands all together and contracts all together as a whole in the stacking direction (thickness direction) of the piezoelectric element layers 341.

The anchor weight 305 has a sufficient weight with respect to the drive shaft 349. The anchor weight 305 is fixedly positioned, and thereby does not move even when the actuator body 304 produces stretching vibration. That is, almost all the expansive and contractive displacement of the actuator body 304 is turned into a displacement of the drive shaft 349.

The drive shaft 349 is attached to the actuator body 304 such that the axis thereof is coincident with the stacking direction, i.e., expanding and contracting direction, of the actuator body 304. This means that expansion and contraction of the actuator body 304 causes the drive shaft 349 to be displaced along the axis thereof according to the expansive and contractive displacement of the actuator body 304. The drive shaft 349 holds friction members 313 provided in the attachment section 312 of the lens frame 310 by friction.

A pair of the friction members 313 are provided in the attachment section 312 of the lens frame 310. The friction members 313 are biased so as to press toward each other by springs 314. A groove 315 having a V-shaped cross section is formed on a surface facing the mating friction member 313, of each of the friction members 313. The drive shaft 349 is sandwiched by the friction members 313 within the grooves 315. In this configuration, the friction members 313 are biased toward the drive shaft 349 by the springs 314, and friction force is applied between the friction members 313 and the drive shaft 349. In this way, the lens frame 310 is being held to the drive shaft 349 without moving relative to the drive shaft 349.

A control section (not shown) similar to that of the first embodiment is connected to the ultrasonic actuator 302 having such a configuration. The ultrasonic actuator 302 is controlled by a drive voltage from the control section. The drive signal is an AC signal, more specifically, a pulse signal. In the third embodiment, the control section provides both duty-cycle control, which varies a duty cycle (ratio of a pulse width of a positive pulse to a pulse period (the sum of the pulse widths of a positive (high level) pulse and a negative (low level) pulse)) of the drive voltages applied to the ultrasonic actuator 302, and wave-number control, which varies the number of pulses included in the drive voltage. When the actuator body 304 is supplied with a drive voltage and is actuated, the drive shaft 349 vibrates in the axial direction thereof. In doing so, an inertial force is applied to the drive shaft 349 depending on the acceleration of the vibration. If the inertial force is less than the friction force between the drive shaft 349 and the friction members 313, the friction members 313, and hence, the lens frame 310 move together with the drive shaft 349. Meanwhile, if the acceleration increases and the inertial force exceeds the friction force between the drive shaft 349 and the friction members 313, the drive shaft 349 slides with respect to the friction members 313, thus only the drive shaft 349 moves.

A basic configuration of the control section (not shown) of this embodiment is similar to the control section 7 of the first embodiment. Specifically, similarly to the first embodiment, the control section includes a target-position setting section, a subtracter, a position control section, a burst control section, and a pulse generation section. In addition to these components, the control section includes a duty-cycle control section and an amplifier.

The position control section of this embodiment is different from the position control section 73 of the first embodiment in that the position control section of this embodiment computes a duty-cycle control amount to be applied to the pulse signal based on a deviation between the target and the current positions of the focusing lens 15, and outputs an output signal depending thereon to the duty-cycle control section. The position control section computes the proportional term, the integral term, and the derivative term from the deviation, and sums up these terms, thereby computing the duty-cycle control amount. That is, the position control section computes the duty-cycle control amount using PID control.

The burst control section determines the number of pulses included in each burst period based on the sum of the proportional and the integral terms from the position control section. This sum of the proportional and the integral terms is a parameter associated with the duty cycle of the pulse signal. Thereafter, the burst control section outputs the output signal associated with the number of pulses to the pulse generation section.

The duty-cycle control section determines the duty cycle of the pulses based on the output signal from the position control section. Thereafter, the duty-cycle control section outputs an output signal associated with the duty cycle to the pulse generation section.

The pulse generation section continuously outputs a burst signal including, in a burst period, as many pulses as a number depending on the output signal from the burst control section, each pulse having a duty cycle depending on the output signal from the duty-cycle control section. The burst signal output from the pulse generation section is input to the amplifier.

The amplifier amplifies the input burst signal, and applies the amplified signal to the ultrasonic actuator 302 as a pulse signal.

As described above, the control section of the first embodiment and the control section of the third embodiment are different in that while a two-phase drive voltage is output in the first embodiment, a single-phase drive voltage is output in the third signal, and in that while the phase difference in the two-phase drive voltage is controlled in the first embodiment, the duty cycle of the single-phase drive voltage is controlled in the third embodiment. Also, the part of the variations of the first embodiment, the second embodiment, and the variations thereof where control is provided using a parameter associated with the phase difference can be applied to the third embodiment by providing control using a parameter associated with the duty cycle. That is, in the third embodiment, a parameter associated with the duty cycle (e.g., the proportional term and the integral term of PID control) is used as the monitoring parameter.

Figure 30:
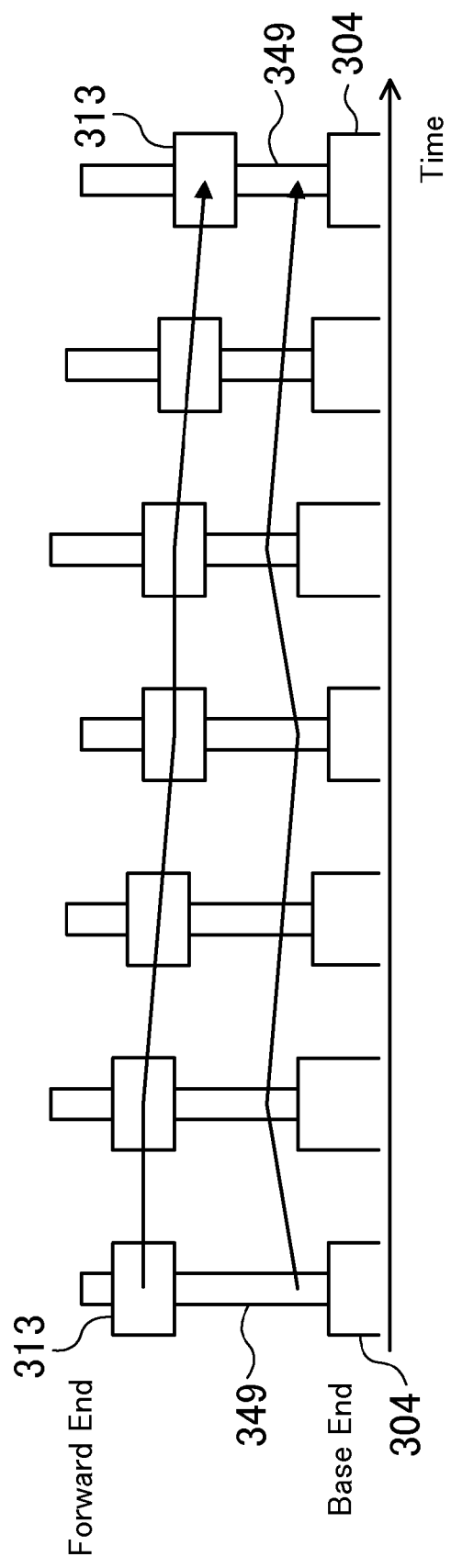
FIG. 30 is a schematic diagram illustrating a temporal change in the position of a drive shaft and a friction member of a lens frame in a drive state.

Next, operation of the ultrasonic actuator 302 will be described in more detail with reference to FIGS. 28A-28B, 29A-29B, and 30. FIGS. 28A and 28B are graphs for a stand-by state; FIG. 28A shows the drive signal, and FIG. 28B shows the position of the drive shaft 349. FIGS. 29A and 29B are graphs for a drive state; FIG. 29A shows the drive signal, and FIG. 29B shows the position of the drive shaft 349. FIG. 30 illustrates a temporal change in the position of the drive shaft 349 and one of the friction members 313 of the lens frame (not shown) in a drive state. In this embodiment, it is assumed for purposes of illustration that the actuator body 304 expands when the drive signal is at a high level, while the actuator body 304 contracts when the drive signal is at a low level.

When a power supply of the ultrasonic actuator 302 is turned on, a drive signal in a stand-by state shown in FIG. 28A is applied to the actuator body 304. The drive signal in a stand-by state has a duty cycle of 50%. In this case, the actuator body 304 is abruptly displaced upon both expansion and contraction, thereby causing the drive shaft 349 to slide with respect to the friction members 313, hence the lens frame 310. As a result, only the drive shaft 349 is displaced back and forth in the longitudinal direction, and the lens frame 310 stays in the same position.

Meanwhile, in a drive operation, a drive signal shown in FIG. 29A is applied to the actuator body 304. The drive signal in a drive operation has a duty cycle different from 50%. For example, the duty cycle is set to 30% in FIG. 29A. Applied such a drive signal, the actuator body 304 is abruptly displaced when the drive signal is at a high level (i.e., upon expansion), while the actuator body 304 is slowly displaced when the drive signal is at a low level (i.e., upon contraction). As a result, as shown in FIG. 30, the drive shaft 349 slides with respect to the friction members 313, thus the lens frame 310 does not move when the actuator body 304 expands, while the friction members 313 are engaged with the drive shaft 349 by friction force, thus the lens frame 310 is displaced toward the base end of the drive shaft 349 together with the drive shaft 349 when the actuator body 304 contracts. As such, the lens frame 310 moves toward the base end, repeating cycles of stop, displacement toward the base end, stop, displacement toward the base end, . . .

Note that while the above description has been directed to a case where sliding with respect to the friction members 313 occurs when the drive shaft 349 is displaced in one axial direction, and sliding with respect to the friction members 313 does not occur when the drive shaft 349 is displaced in the other axial direction, it is not to be construed as limiting. That is, there may be a case where sliding with respect to the friction members 313 occurs when the drive shaft 349 is displaced in both one axial direction and the other axial direction. Even in such a case, the friction members 313, hence the lens frame 310 can be moved. This is possible because durations of kinetic friction force acting against the friction members 313 are different for a displacement in one axial direction and a displacement in the other axial direction of the drive shaft 349.

Although a duty cycle of 30% is used in the above example, adjusting the duty cycle allows the speed of the lens frame 310 to be adjusted. In addition, while the duty cycle is changed to less than 50% in the above example, the duty cycle may be changed to greater than 50%. Changing the duty cycle to greater than 50% allows the lens frame 310 to move toward the forward end of the drive shaft 349.

In this way, adjusting the duty cycle of the drive signal allows the moving direction and the moving speed of the lens frame 310 to be adjusted. For example, changing the duty cycle toward 50% causes the moving speed of the lens frame 310 to be reduced, while changing the duty cycle away from 50% causes the moving speed of the lens frame 310 to be increased.

In this duty-cycle control, the frequency of the drive voltage remains the frequency set depending on a resonant frequency of the actuator body 304, and also, the voltage value of the drive voltage is maintained at a constant level across the entire range of control. Therefore, even when the duty cycle is set near 50% to output a low driving force, a drive voltage having a frequency depending on a resonant frequency and having a sufficient voltage value maintained is applied, thereby allowing a desired driving force to be properly output. However, despite a low driving force, since the voltage value of the drive voltage is maintained at a constant value, power consumption is high for a low driving force.

Thus, the control section controls a driving force using duty-cycle control and wave-number control in combination. That is, the control section reduces power consumption by providing wave-number control over the drive voltage, while providing duty-cycle control. In particular, when a required driving force is small, the actuator body 304 can be properly vibrated even if the number of pulses included in a drive voltage is reduced. However, a reduction in the number of pulses included in a burst period causes the driving force to ultimately reach zero before the number of pulses reaches zero (i.e., the burst rate reaches zero). Therefore, in wave-number control, the minimum number of pulses included in a burst period is set to a minimum value (three, in this embodiment) with which of pulses the driven components, such as the lens frame 310, can be driven. In this embodiment, the control section controls the driving force using duty-cycle control utilizing a drive signal, which is a continuous wave, when a required driving force is relatively large; and controls the driving force using duty-cycle control along with adjusting the number of pulses using wave-number control when a required driving force is relatively small.

Specifically, the control section applies a pulse signal as shown in FIG. 31 to the actuator body 304 while in a stand-by state. In a stand-by state, although there is no need to drive the friction members 313, resonant vibration needs to be induced in the actuator body 304 in order to be ready for a rapid transition to a drive state. For the pulse signal in a stand-by state, the burst period is set to a period of six pulses. Three pulses are output in the first half of the burst period, and the rest period corresponding to three pulses is an idle period during which no pulses are output. During each idle period, a voltage such that the piezoelectric element layers 341 of the actuator body 304 are displaced to a neutral position is applied. While pulses are output, the drive shaft 349 is vibrated depending on the pulses. In the idle periods, the vibration of the drive shaft 349 is dampened. During this period, although the magnitude of the vibration of the drive shaft 349 is reduced, sliding occurs between the drive shaft 349 and the friction members 313, thereby causing the friction members 313 to stay in approximately same positions. Even if the friction members 313 are vibrated together with the drive shaft 349 by friction force, the vibration of the drive shaft 349 should have been significantly dampened in such a case, thus the amplitude and the amount of movement thereof should be small. This idle period is set to a time period during which the resonant vibration of the actuator body 304 is not completely dampened.

Meanwhile, in a drive state, the control section applies a pulse signal as shown in FIG. 32 to the actuator body 304. The duty cycle is set to 30% in this pulse signal. In addition, this burst signal outputs three pulses in the first half of each burst period, and an idle period corresponding to three pulses is provided in the second half. While pulses are output, the drive shaft 349 is abruptly displaced when the pulses are at a high level, while the drive shaft 349 is slowly displaced when the pulses are at a low level. As a result, the friction members 313 move toward the base end of the drive shaft 349. In the idle periods, the magnitude of the vibration of the actuator body 304 is gradually reduced, and vibratory movement becomes symmetrical in terms of the direction toward the base end and the direction toward the forward end. As a result, the friction members 313 and the drive shaft 349 slide equally in both one axial direction and the other axial direction, thereby causing the friction members 313 to stay in approximately same positions. However, the resonant vibration of the actuator body 304 is maintained even in such a case. When a next pulse is output thereafter, the abrupt and slow vibrations of the actuator body 304 are started again, and the friction members 313 start to move again.

Figure 34A:
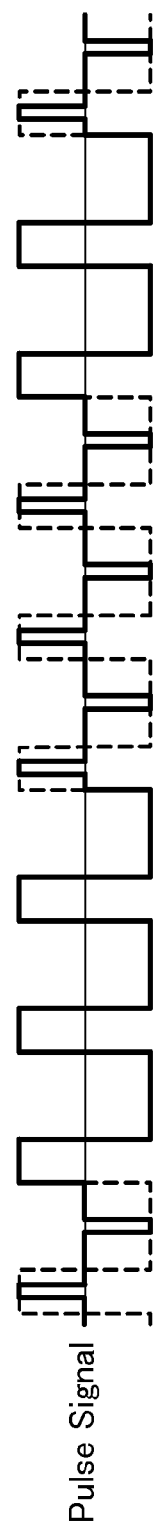
FIGS. 34A and 34B are graphs illustrating wave-number control outputting short pulses in a drive state.
Figure 34B:

Note that, in the idle period, short pulses similar to those of the first embodiment may be output as shown in FIGS. 33A and 34A. Short pulses are output both at a high level and at a low level. In addition, the short pulses are each output at the substantially central time point in each pulse output period of the normal pulse. Accordingly, in the idle periods, the period of a short pulse is the same as the pulse period (an output period for a positive pulse and a negative pulse with a duty cycle of 50%) both in an idle state and in a drive state. In this way, outputting short pulses even in the idle periods, instead of outputting no pulses, allows a drive voltage, although small, to be applied to the actuator body 304. Thus, the resonant vibration of the actuator body 304 can be maintained. As compared to the case where no short pulses are output (see FIGS. 31A-31B and 32A-32B), the vibration of the drive shaft 349 is not significantly dampened in the idle periods. In this way, even with a configuration such that short pulses are output in the idle periods, since the short pulses have reduced pulse widths, power consumption can be reduced as compared to the case of a continuous wave in which normal pulses are continuously output. In addition, since the burst period can be set longer as compared to the case where no short pulses are output in the idle periods, it may be possible to reduce power consumption depending on the condition.

Moreover, also in this embodiment, starting control similar to that of the first embodiment is provided as shown in FIGS. 35A and 35B. That is, the control section outputs a pulse signal having a duty-cycle of 50% for a time period from start-up of the actuator body 304 until a predetermined stand-by period has elapsed. Wave-number control is provided during this time period, and an idle period is provided in the second half of each burst period. Specifically, during the stand-by period, the period to output three pulses and the idle period are repeated, and resonant vibration is induced in the actuator body 304. In this regard, since the actuator body 304 vibrates equally in both axial directions of the drive shaft 349, the friction members 313 stay in approximately same positions. After the stand-by period has elapsed, the control section outputs a pulse signal having a duty cycle different from 50% to the actuator body 304. This causes the actuator body 304 to vibrate, moving speed of which is different in one and the other axial directions of the drive shaft 349, thereby allowing the friction members 313 to move depending on the degree of the asymmetry of the moving speed. In this regard, wave-number control is provided when a driving force during start-up is small. In FIG. 35A, idle periods are also provided in the pulse signal after the stand-by period has elapsed. Note that starting control does not necessarily need to be provided with the number of pulses reduced, but may be provided using a pulse signal which is a continuous wave. In addition, idle periods may only be provided during the stand-by period (i.e., while a pulse signal having a duty-cycle of 50% is output).

Other Embodiments

The disclosed technology may be implemented using the configurations described below in association with the presented embodiments.

The configuration of the ultrasonic actuator 2 is not limited to the aforementioned configurations. For example, in the above embodiments, a configuration has been described in which the driver elements 49 are provided on a longer side face of the actuator body 4, and the direction of stretching vibration of the actuator body 4 is aligned with the output direction of the driving force, while the direction of bending vibration is aligned with the direction in which the driver elements 49 are pressed against the abutment member 81*a*. However, the disclosed technology is not limited to this particular configuration. Instead, the configuration may be such that the driver elements 49 are provided on a shorter side face of the actuator body 4, and the direction of stretching vibration of the actuator body 4 is aligned with the direction in which the driver elements 49 are pressed against the abutment member 81*a*, while the direction of bending vibration is aligned with the output direction of the driving force.

In addition, in the above embodiments, a configuration has been described in which the driver elements 49 are pressed against the abutment member 81*a*, which is a member of the fixed part, while the ultrasonic actuator 2 is attached to the movable case 82, which is a member of the movable part, such that the ultrasonic actuator 2 itself is movable. However, the disclosed technology is not limited to this particular configuration. That is, the configuration may be such that the driver elements 49 are pressed against a member of the movable part, while the ultrasonic actuator 2 is attached to a member of the fixed part such that the ultrasonic actuator 2 itself is not movable.

Moreover, while in the above embodiments, the first-order mode of stretching vibration and the second-order mode of bending vibration are induced in the actuator body 4, other modes or vibrations may be induced.

Furthermore, in the above embodiments, the principal faces, each having a generally rectangular shape in planar view, of the piezoelectric element layers 41 are each divided into four regions as described previously, and a different voltage is applied to each diagonally disposed pair of electrodes. However, the disclosed technology is not limited to this particular configuration. Four electrodes provided in the piezoelectric element layers 41 may each be supplied with a different voltage from the other voltages, or the electrodes may be arranged in a different way. In such a case, the phase differences between the plurality of drive voltages applied to the electrodes will be different from that of the configuration described previously. Specifically, in the above configuration, the principal faces, each having a generally rectangular shape in planar view, of the piezoelectric element layers 41 are each divided into four regions as described previously, and a different voltage is applied to each diagonally disposed pair of electrodes, thus a phase difference between the two drive voltages of 90° provides a maximum driving force, while a phase difference between the two drive voltages of 0° or 180° provides a minimum driving force. However, the phase difference which results in a maximum or minimum driving force varies depending on the shape of the piezoelectric element layers 41, the arrangement of the electrodes, etc.

In addition, while the above embodiments have been described in which the driving force is controlled using either phase control or duty-cycle control and wave-number control over one or more drive voltages in combination, it is in no way intended to exclude frequency control, voltage-value control, etc., over the drive voltages. That is, as far as the driving force is controlled using either phase control or duty-cycle control and wave-number control in combination, frequency control and/or voltage-value control over the drive voltages may be additionally provided.

Moreover, while the above embodiments have been described in which a member of the movable part (i.e., the movable case 82) is configured to undergo linear motion, the member of the movable part may be configured to undergo rotary motion. Specifically, the configuration may be such that the driver elements 49 are pressed against the periphery of a disk-shaped body, and the disk-shaped body is rotated as the member of the movable part; or the ultrasonic actuator 2 is attached to a member of the movable part, which is rotatable around a predetermined rotation axis, and the ultrasonic actuator 2 rotates together with the member of the movable part.

Furthermore, while the above embodiments have been directed to a configuration in which the actuator body 4 is formed by a piezoelectric element, it is not to be construed as limiting. For example, the configuration may be such that a metallic resonator is formed, a piezoelectric element is attached to the resonator, and the piezoelectric element is vibrated, thereby allowing the entire resonator to vibrate. In this case, the resonator forms the actuator body.

As described above, the disclosed technology is useful for a drive unit having a vibratory actuator.

The present invention is not limited to the presented embodiments, and may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes and modifications which come within the meaning and range of equivalency of the claims are to be embraced within their scope.

What is claimed is:

1. A drive unit, comprising:
a vibratory actuator having an actuator body formed using a piezoelectric element, and configured to output a driving force by vibration of the actuator body; and
a control section configured to induce vibration in the actuator body by supplying a plurality of pulse signals or a single-phase pulse signal to the piezoelectric element, wherein
the control section provides, in combination, either phase control, which controls the driving force by adjusting a phase difference between the plurality of pulse signals, or duty-cycle control, which controls the driving force by adjusting a duty cycle of the single-phase pulse signal, and wave-number control, which controls the driving force by adjusting the number of pulses included in a predetermined burst period in each of the pulse signals or in the pulse signal.

2. The drive unit of claim 1, wherein
in the wave-number control, the control section adjusts the number of pulses included in the burst period based on a parameter associated with the phase difference in the phase control or a parameter associated with the duty cycle in the duty-cycle control.

3. The drive unit of claim 2, wherein
the control section
increments the number of pulses included in the burst period by one when the parameter has been greater than a predetermined first threshold during a time period longer than a predetermined first duration, and
decrements the number of pulses included in the burst period by one when the parameter has been less than a second threshold, which is less than the first threshold, during a time period longer than a predetermined second duration.

4. The drive unit of claim 2, wherein
the control section
tentatively increments the number of pulses included in the burst period by one when the parameter has been greater than a predetermined first threshold during a time period longer than a predetermined first duration; restores the number of pulses to the original value after a predetermined first holding time has elapsed; and then, if the parameter has again been greater than the first threshold during a time period longer than the first duration, ultimately increments the number of pulses by one, and
tentatively decrements the number of pulses included in the burst period by one when the parameter has been less than a second threshold, which is less than the first threshold, during a time period longer than a predetermined second duration; restores the number of pulses to the original value after a predetermined second holding time has elapsed; and then, if the parameter has again been less than the second threshold during a time period longer than the second duration, ultimately decrements the number of pulses by one.

5. The drive unit of claim 2, wherein
the control section divides the parameter into a plurality of regions based on a value thereof, and assigns a number of pulses included in the burst period to each of the regions.

6. The drive unit of claim 5, wherein
the control section sets each lower limit value of the regions to which corresponding numbers of pulses are assigned for a case where the parameter decreases in value, below each lower limit for a case where the parameter increases in value.

7. The drive unit of claim 2, wherein
the control section adjusts the number of pulses included in the burst period depending on a value of the parameter, and adjusts the pulse width of at least one of the pulses included in the burst period.

8. The drive unit of claim 7, wherein
the control section adjusts the number of pulses included in the burst period and the pulse width of the at least one pulse so that the sum of the pulse widths of the pulses included in the burst period is proportional to the value of the parameter.

9. The drive unit of claim 2, wherein
the control section obtains an amount of control for the phase difference or an amount of control for the duty cycle using PID control based on a deviation between an actual operational condition and a target operational condition of a driven object driven by the vibratory actuator, and
the parameter in the wave-number control is at least one of an integral term or a proportional term of the PID control.

10. The drive unit of claim 2, wherein
the control section obtains an amount of control for the phase difference or an amount of control for the duty cycle using feedback control based on a deviation between an actual operational condition and a target operational condition of a driven object driven by the vibratory actuator; includes an observer which is designed based on models of the driven object and the vibratory actuator; and corrects the amount of control for the phase difference or the amount of control for the duty cycle by an amount of correction from the observer, and
the parameter in the wave-number control is the amount of correction from the observer.

11. The drive unit of claim 1, wherein
the control section provides the phase control; and induces only vibration which does not include a vibration component in a drive direction of a driven object driven by the vibratory actuator, in the actuator body, by controlling the phase difference between the plurality of pulse signals, during a predetermined stand-by period when vibration of the actuator body is started, and induces vibration which includes the vibration component in the drive direction, in the actuator body, after the stand-by period has elapsed.

12. The drive unit of claim 1, wherein
the control section provides the duty-cycle control; and does not move a driven object driven by the vibratory actuator in a drive direction, by controlling the duty-cycle of the pulse signal to 50%, during a predetermined stand-by period when vibration of the actuator body is started, and moves the driven object in the drive direction by varying the duty-cycle of the pulse signal from 50% after the stand-by period has elapsed.

13. The drive unit of claim 11, wherein
the control section sets the number of pulses included in the burst period to a minimum value with which the vibration of the actuator body can be maintained during the stand-by period.

14. The drive unit of claim 12, wherein
the control section sets the number of pulses included in the burst period to a minimum value with which the vibration of the actuator body can be maintained during the stand-by period.

15. The drive unit of claim 1, wherein
in the wave-number control, a minimum number of pulses included in the burst period or a maximum duration of an idle period during which no pulse signals are output in the burst period is set to a value with which the vibration of the actuator body can be maintained.

16. The drive unit of claim 1, wherein
when decelerating a driven object driven by the vibratory actuator, the control section adjusts the number of pulses included in the burst period to a value less than a minimum value with which the driven object can be driven.

17. The drive unit of claim 1, wherein
in the wave-number control, the control section adjusts the number of pulses in a normal waveform, each having a predetermined pulse width, included in the burst period; and outputs one or more short pulses each having a pulse width shorter than that of the pulses in the normal waveform during an idle period during which no pulses in the normal waveform are output in the burst period.

18. The drive unit of claim 17, wherein
the control section outputs the one or more short pulses only in a latter portion of the idle period.

19. A lens barrel, comprising:
a lens; and
the drive unit of claim 1 configured to drive the lens.

20. A camera, comprising:
a lens; and
the drive unit of claim 1 configured to drive the lens.

* * * * *